US012641838B2

(12) United States Patent
Shimizu

(10) Patent No.: US 12,641,838 B2
(45) Date of Patent: May 26, 2026

(54) SEMICONDUCTOR DEVICE, METHOD OF MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 482 days.

(21) Appl. No.: 18/177,245

(22) Filed: Mar. 2, 2023

(65) Prior Publication Data

US 2024/0096938 A1     Mar. 21, 2024

(30) Foreign Application Priority Data

Sep. 16, 2022     (JP) ................................. 2022-148328

(51) Int. Cl.
H10D 62/10          (2025.01)
H10D 12/01          (2025.01)
(Continued)

(52) U.S. Cl.
CPC ......... H10D 62/111 (2025.01); H10D 12/031 (2025.01); H10D 30/668 (2025.01); (Continued)

(58) Field of Classification Search
CPC ............. H10D 30/0297; H10D 30/668; H10D 62/054; H10D 62/107; H10D 62/111; H10D 62/393; H10D 62/8325
(Continued)

(56) References Cited

U.S. PATENT DOCUMENTS

| 2017/0338302 A1 | 11/2017 | Hsieh et al. |
| 2018/0248002 A1 | 8/2018 | Kawada et al. |
| | (Continued) | |

FOREIGN PATENT DOCUMENTS

| JP | 2018142682 A | 9/2018 |
| JP | 2019195081 A | 11/2019 |
| | (Continued) | |

OTHER PUBLICATIONS

Not yet published, Japanese Patent Application No. 2022-045395, filed on Mar. 22, 2022.

(Continued)

*Primary Examiner* — Fazli Erdem
(74) *Attorney, Agent, or Firm* — Maier & Maier, PLLC

(57)          ABSTRACT

A semiconductor device of an embodiment includes a silicon carbide layer including a first face parallel to a first direction, a first trench and a second trench extending in the first direction, a first gate electrode in the first trench, a second gate electrode in the second trench, an n-type first silicon carbide region, a p-type second silicon carbide region between the first silicon carbide region and the first face, an n-type third silicon carbide region between the second silicon carbide region and the first face, a p-type fourth silicon carbide region at a bottom of the first trench, and a fifth silicon carbide region at a bottom of the second trench. A width of the fourth silicon carbide region is less than a width of the first trench, and a length of the fourth silicon carbide region is more than the width of the fourth silicon carbide region.

4 Claims, 19 Drawing Sheets

(51) Int. Cl.

| | |
|---|---|
| *H10D 30/66* | (2025.01) |
| *H10D 62/17* | (2025.01) |
| *H10D 62/832* | (2025.01) |
| *H10P 30/22* | (2026.01) |
| *B60R 16/02* | (2006.01) |
| *B61C 3/00* | (2006.01) |
| *B66B 11/04* | (2006.01) |
| *H02P 27/06* | (2006.01) |

(52) U.S. Cl.

CPC ....... *H10D 62/393* (2025.01); *H10D 62/8325* (2025.01); *H10P 30/22* (2026.01); *B60R 16/02* (2013.01); *B61C 3/00* (2013.01); *B66B 11/043* (2013.01); *H02P 27/06* (2013.01)

(58) Field of Classification Search

USPC ........................................................ 257/77

See application file for complete search history.

(56) References Cited

U.S. PATENT DOCUMENTS

| | | | | |
|---|---|---|---|---|
| 2019/0245079 | A1* | 8/2019 | Imai | ..................... H10D 62/393 |
| 2021/0036116 | A1 | 2/2021 | Kyogoku et al. | |
| 2021/0288156 | A1 | 9/2021 | Fukui et al. | |
| 2023/0307236 | A1* | 9/2023 | Shimizu | ................. H10D 30/66 |
| 2024/0088258 | A1* | 3/2024 | Shimizu | .............. H10D 30/668 |

FOREIGN PATENT DOCUMENTS

| | | | |
|---|---|---|---|
| JP | 2021027138 A | 2/2021 | |
| JP | 2021182639 A | 11/2021 | |
| JP | 202214471 A | 1/2022 | |
| JP | 2023140254 A | 10/2023 | |
| JP | 202439822 A | 3/2024 | |

OTHER PUBLICATIONS

Not yet published, Japanese Patent Application No. 2022-107884, filed on Jul. 4, 2022.

U.S. Appl. No. 17/929,419, projected publication date on Sep. 28, 2023; Corresponds to NPL Nos. 1 and 2.

Not yet published, Japanese Patent Application No. 2022-144471, filed on Sep. 12, 2022.

U.S. Appl. No. 18/177,210, filed Mar. 2, 2023; Corresponds to NPL No. 4.

* cited by examiner

FIG.1   AA' CROSS SECTION

FIG.13 BB' CROSS SECTION

FIG.14 CC' CROSS SECTION

SEMICONDUCTOR DEVICE, METHOD OF MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2022-148328, filed on Sep. 16, 2022, the entire contents of which are incorporated herein by reference.

FIELD

Embodiments described herein relate generally to a semiconductor device, a method of manufacturing a semiconductor device, an inverter circuit, a drive device, a vehicle, and an elevator.

BACKGROUND

Silicon carbide (SiC) is expected as a material for a next-generation semiconductor device. The silicon carbide has excellent physical properties such as a band gap of about 3 times, a breakdown field strength of about 10 times, and a thermal conductivity of about 3 times those of silicon. These physical properties are utilized, and thus, a semiconductor device capable of being operated at a high temperature with low loss can be realized.

A metal oxide semiconductor field effect transistor (MOSFET) using silicon carbide is required to reduce an on-resistance. In order to reduce the on-resistance of the MOSFET, a vertical MOSFET of trench gate type in which a gate electrode is provided in a trench is adopted.

In the vertical MOSFET, there is a super junction structure (hereinafter, also referred to as a "SJ structure") in which a p-type region and an n-type region are alternately arrayed in a lateral direction as a structure for achieving both a high breakdown voltage and a low on-resistance. The SJ structure relaxes electric field intensity in a semiconductor by a depletion layer extending in the lateral direction in the p-type region and the n-type region, and realizes the high breakdown voltage of the MOSFET. At the same time, the low on-resistance of the MOSFET can be realized by increasing a concentration of an impurity region.

The vertical MOSFET of trench gate type and the SJ structure are combined to further scale-down the SJ structure, and thus, the on-resistance can be further reduced.

DETAILED DESCRIPTION

Figure 1:
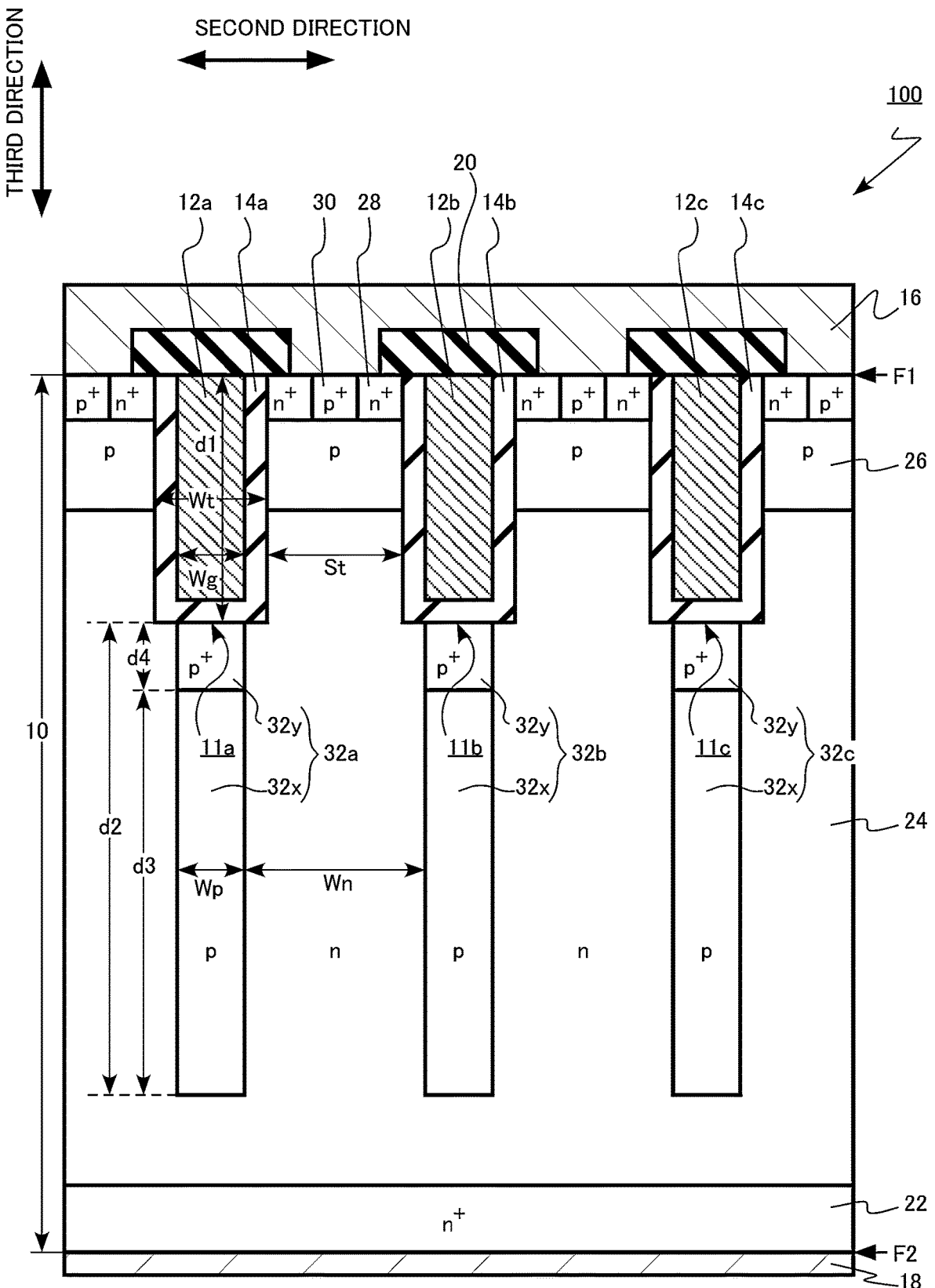
FIG. 1 is a schematic cross-sectional view of a semiconductor device of a first embodiment.

A semiconductor device of an embodiment includes a silicon carbide layer including a first face parallel to a first direction and a second direction perpendicular to the first direction and a second face parallel to the first face; a first trench disposed in the silicon carbide layer, the first trench extending in the first direction on the first face; a first gate electrode disposed in the first trench; a first gate insulating layer disposed between the first gate electrode and the silicon carbide layer; a second trench disposed in the silicon carbide layer, the second trench extending in the first direction on the first face, the second trench disposed in the second direction with respect to the first trench; a second gate electrode disposed in the second trench; a second gate insulating layer disposed between the second gate electrode and the silicon carbide layer; an n-type first silicon carbide region disposed in the silicon carbide layer; a p-type second silicon carbide region disposed in the silicon carbide layer, the p-type second silicon carbide region disposed between the n-type first silicon carbide region and the first face, the p-type second silicon carbide region disposed between the first trench and the second trench; an n-type third silicon carbide region disposed in the silicon carbide layer, the n-type third silicon carbide region disposed between the p-type second silicon carbide region and the first face; a p-type fourth silicon carbide region disposed in the silicon carbide layer, the p-type fourth silicon carbide region disposed between the n-type first silicon carbide region and the first trench; a p-type fifth silicon carbide region disposed in the silicon carbide layer, the p-type fifth silicon carbide region disposed between the n-type first silicon carbide region and the second trench; a first electrode disposed on a side of the first face with respect to the silicon carbide layer, and electrically connected to the p-type second silicon carbide region and the n-type third silicon carbide region; and a second electrode disposed on a side of the second face with respect to the silicon carbide layer. A width of the p-type fourth silicon carbide region in the second direction is less than a width of the first trench in the second direction, and a length of the p-type fourth silicon carbide region in a third direction from the first face to the second face is more than the width of the p-type fourth silicon carbide region in the second direction.

Hereinafter, embodiments of the present disclosure will be described with reference to the drawings. In the following description, the same or similar members will be denoted by the same reference numerals, and the description of the members once described will be appropriately omitted.

In addition, in the following description, when the notations of $n^{++}$, $n^+$, n, $n^-$, and $p^{++}$, p, $p^-$ are used, these notations indicate relative levels of impurity concentrations in conductivity types. That is, $n^{++}$ has an n-type impurity concentration relatively more than $n^+$, $n^+$ has an n-type impurity concentration relatively more than n, and $n^-$ has an n-type impurity concentration relatively less than n. In addition, $p^{++}$ has a p-type impurity concentration relatively more than $p^+$, $p^+$ has a p-type impurity concentration relatively more than p, and $p^-$ has a p-type impurity concentration relatively less than p. In some cases, $n^{++}$-type, $n^+$-type, and $n^-$-type are simply referred to as n-type, and $p^{++}$-type, $p^+$-type, and $p^-$-type are simply referred to as p-type.

The impurity concentration can be measured by, for example, secondary-ion mass spectrometry (SIMS). In addition, a relative level of the impurity concentration can be determined from a level of a carrier concentration obtained by, for example, scanning capacitance microscopy (SCM). In addition, distances such as a width and a depth of an impurity region can be obtained by, for example, SIMS. In addition, the distances such as a width and a depth of the impurity region can be obtained from, for example, an SCM image.

A width of a trench, an interval of the trench, a depth of the trench, and a thickness of an insulating layer can be measured on, for example, SIMS or a transmission electron microscope (TEM) image.

First Embodiment

A semiconductor device of a first embodiment includes a silicon carbide layer including a first face parallel to a first direction and a second direction perpendicular to the first direction and a second face parallel to the first face, a first trench present in the silicon carbide layer, and extending in the first direction on the first face, a first gate electrode disposed in the first trench, a first gate insulating layer disposed between the first gate electrode and the silicon carbide layer, a second trench present in the silicon carbide layer, extending in the first direction on the first face, and disposed in the second direction with respect to the first trench, a second gate electrode disposed in the second trench, a second gate insulating layer disposed between the second gate electrode and the silicon carbide layer, an n-type first silicon carbide region disposed in the silicon carbide layer, a p-type second silicon carbide region disposed in the silicon carbide layer, disposed between the first silicon carbide region and the first face, and disposed between the first trench and the second trench, an n-type third silicon carbide region disposed in the silicon carbide layer, and disposed between the second silicon carbide region and the first face, a p-type fourth silicon carbide region disposed in the silicon carbide layer, and disposed between the first silicon carbide region and the first trench, a p-type fifth silicon carbide region disposed in the silicon carbide layer, and disposed between the first silicon carbide region and the second trench, a first electrode disposed on a side of the first face with respect to the silicon carbide layer, and electrically connected to the second silicon carbide region and the third silicon carbide region, and a second electrode disposed on a side of the second face with respect to the silicon carbide layer. A width of the fourth silicon carbide region in the second direction is less than a width of the first trench in the second direction, and a length of the fourth silicon carbide region in a third direction from the first face to the second face is more than the width of the fourth silicon carbide region in the second direction.

FIG. 1 is a schematic cross-sectional view of the semiconductor device of the first embodiment. The semiconductor device of the first embodiment is a vertical MOSFET 100 of trench gate type using silicon carbide. The MOSFET 100 is a MOSFET of n-channel type using electrons as carriers. The MOSFET 100 has an SJ structure.

Figure 2:
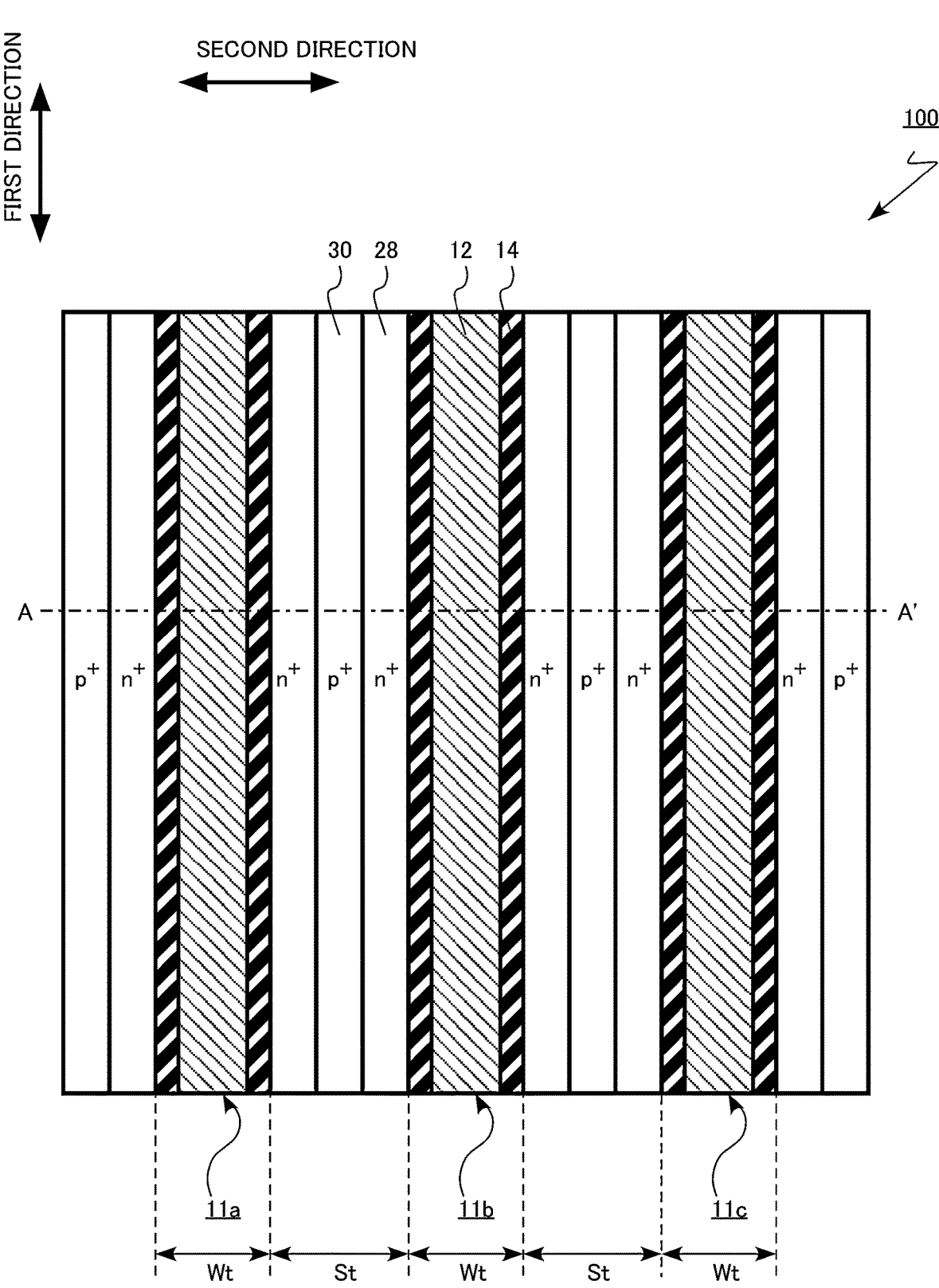
FIG. 2 is a schematic plan view of the semiconductor device of the first embodiment.

FIG. 2 is a schematic plan view of the semiconductor device of the first embodiment. FIG. 2 is a plan view of a first face (F1 in FIG. 1) of FIG. 1. A first direction and a second direction are directions parallel to the first face F1. In addition, the second direction is a direction perpendicular to the first direction. FIG. 1 is an AA' cross section of FIG. 2.

The MOSFET 100 includes a silicon carbide layer 10, a first trench 11a, a second trench 11b, a third trench 11c, a first gate electrode 12a, a second gate electrode 12b, a third gate electrode 12c, a first gate insulating layer 14a, a second gate insulating layer 14b, a third gate insulating layer 14c, a source electrode 16 (first electrode), a drain electrode 18 (second electrode), and an interlayer insulating layer 20.

Hereinafter, the first trench 11a, the second trench 11b, and the third trench 11c may be collectively referred to as a trench 11. Hereinafter, the first gate electrode 12a, the second gate electrode 12b, and the third gate electrode 12c may be collectively referred to as a gate electrode 12. Hereinafter, the first gate insulating layer 14a, the second gate insulating layer 14b, and the third gate insulating layer 14c may be collectively referred to as a gate insulating layer 14.

An $n^+$-type drain region 22, an n-type drift region 24 (first silicon carbide region), a p-type body region 26 (second silicon carbide region), an $n^+$-type source region 28 (third silicon carbide region), a $p^+$-type contact region 30, a p-type first pillar region 32a (fourth silicon carbide region), a p-type second pillar region 32b (fifth silicon carbide region), and a p-type third pillar region 32c are provided in the silicon carbide layer 10.

Each of the first pillar region 32a, the second pillar region 32b, and the third pillar region 32c includes a low-concentration region 32x (first region) and a high-concentration region 32y (second region).

Hereinafter, the first pillar region 32a, the second pillar region 32b, and the third pillar region 32c may be collectively referred to as a pillar region 32.

The silicon carbide layer 10 is a single crystal SiC. The silicon carbide layer 10 is, for example, 4H—SiC.

The silicon carbide layer 10 includes a first face ("F1" in FIG. 1) and a second face ("F2" in FIG. 1). The first face F1 and the second face F2 face each other.

Hereinafter, the first face F1 is also referred to as a front surface, and the second face F2 is also referred to as a back surface. Hereinafter, a "depth" means a depth in a direction toward the second face F2 with respect to the first face F1.

In FIGS. 1 and 2, the first direction and the second direction are parallel to the first face F1 and the second face F2. A third direction is perpendicular to the first face F1 and the second face F2.

Figure 3:
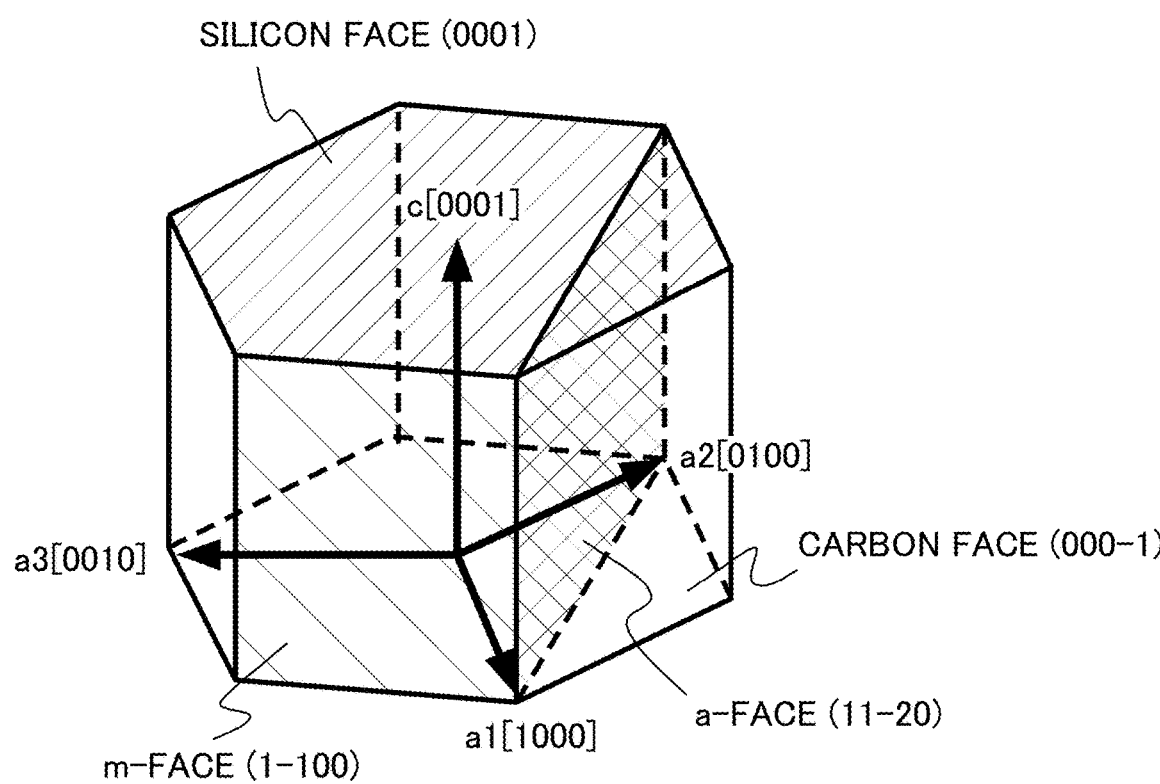
FIG. 3 is a diagram illustrating a crystal structure of a silicon carbide semiconductor.

FIG. 3 is a diagram illustrating a crystal structure of a silicon carbide semiconductor. A typical crystal structure of the silicon carbide semiconductor is a hexagonal crystal system such as 4H—SiC. One of faces having a c-axis along an axial direction of a hexagonal prism as a normal line (top faces of the hexagonal prism) is a (0001) face. A face equivalent to the (0001) face is referred to as a silicon face and is denoted as a {0001} face. Silicon (Si) is arrayed on the silicon face.

The other of the faces having the c-axis along the axial direction of the hexagonal prism as the normal line (top faces of the hexagonal prism) is a (000-1) face. A face equivalent to the (000-1) face is referred to as a carbon face and is denoted as a {000-1} face. Carbon (C) is arrayed on the carbon face.

On the other hand, a side surface (columnar surface) of the hexagonal prism is an m-face which is a face equivalent to a (1-100) face, that is, a {1-100} face. In addition, a face passing through a pair of ridgelines not adjacent to each other is an a-face which is a face equivalent to a (11-20) face, that is, a {11-20} face. Both silicon (Si) and carbon (C) are arrayed on the m-face and the a-face.

The first face F1 is, for example, a face inclined with respect to the (0001) face by an angle equal to or more than 0 degrees and equal to or less than 8 degrees. That is, the first face is a face of which a normal line is inclined with respect to a c-axis in a [0001] direction by an angle equal to or more than 0 degrees and equal to or less than 8 degrees. In other words, an off angle with respect to the (0001) face is equal to or more than 0 degrees and is equal to or less than 8 degrees. In addition, the second face F2 is, for example, a face inclined with respect to the (000-1) face by an angle equal to or more than 0 degrees and equal to or less than 8 degrees.

The (0001) face is called a silicon face. The (000-1) face is called a carbon face.

An inclined direction of the first face F1 and the second face F2 is, for example, a <11-20> direction. The <11-20> direction is an a-axis direction. In FIG. 2, for example, the first direction illustrated in FIG. 2 is in the same face as the a-axis direction.

The trench 11 is present in the silicon carbide layer 10. The trench 11 is a recess provided in the silicon carbide layer 10. The trench 11 extends in the first direction as illustrated in FIG. 2.

A width (Wt in FIGS. 1 and 2) of the trench 11 in the second direction is, for example, equal to or less than an interval (St in FIGS. 1 and 2) between two adjacent trenches 11.

The width (Wt in FIGS. 1 and 2) of the trench 11 in the second direction is, for example, equal to or more than 0.2 μm and is equal to or less than 1.0 μm.

The interval St between two adjacent trenches 11 is equal to or less than 1.0 μm. The interval St between two adjacent trenches 11 is, for example, equal to or more than 0.2 μm and is equal to or less than 1.0 μm. For example, the interval St between the first trench 11a and the second trench 11b is equal to or more than 0.2 μm and is equal to or less than 1.0 μm.

The trenches 11 are repeatedly disposed in the second direction. A repetition pitch of the trenches 11 in the second direction is, for example, equal to or more than 0.4 μm and is equal to or less than 2.0 μm.

For example, a depth of the trench 11 is equal to or more than 0.5 μm and is equal to or less than 2.0 μm.

The inclination angle of the side surface of the trench 11 with respect to the m-face or the a-face is, for example, is equal to or more than 0 degrees and is equal to or less than 5 degrees.

The gate electrode 12 is provided in the trench 11. The first gate electrode 12a is provided in the first trench 11a. The second gate electrode 12b is provided in the second trench 11b. The third gate electrode 12c is provided in the third trench 11c.

The gate electrode 12 is provided between the source electrode 16 and the drain electrode 18. The gate electrode 12 extends in the first direction.

The gate insulating layer 14 is provided between the gate electrode 12 and the silicon carbide layer 10. The first gate insulating layer 14a is provided between the first gate electrode 12a and the silicon carbide layer 10. The second gate insulating layer 14b is provided between the second gate electrode 12b and the silicon carbide layer 10. The third gate insulating layer 14c is provided between the third gate electrode 12c and the silicon carbide layer 10.

The gate insulating layer 14 is provided between each region of the source region 28, the body region 26, the drain region 22, and the pillar region 32 and the gate electrode 12.

The gate electrode 12 is a conductive layer. The gate electrode 12 is, for example, polycrystalline silicon containing a p-type impurity or an n-type impurity.

The gate insulating layer 14 is, for example, a silicon oxide film. For example, a high-k insulating film (high dielectric constant insulating film such as HfSiON, ZrSiON, or AlON) can be applied to the gate insulating layer 14. In addition, for example, a stacked film of a silicon oxide film (SiO$_2$) and a high-K insulating film is also applicable to the gate insulating layer 14.

The interlayer insulating layer 20 is provided on the gate electrode 12. The interlayer insulating layer 20 is, for example, a silicon oxide film.

The source electrode 16 is provided on a front surface side with respect to the silicon carbide layer 10. The source electrode 16 is provided on the front surface of the silicon carbide layer 10.

The source electrode 16 is electrically connected to the source region 28. The source electrode 16 is in contact with the source region 28.

The source electrode 16 is electrically connected to the contact region 30. The source electrode 16 is in contact with the contact region 30.

The source electrode 16 contains metal. The metal for forming the source electrode 16 has, for example, a stacked structure of titanium (Ti) and aluminum (Al).

The drain electrode 18 is provided on a back surface side with respect to the silicon carbide layer 10. The drain electrode 18 is provided on the back surface of the silicon carbide layer 10. The drain electrode 18 is in contact with the drain region 22.

The drain electrode 18 is, for example, metal or a metal semiconductor compound. The drain electrode 18 contains, for example, a material selected from the group consisting of nickel silicide, titanium (Ti), nickel (Ni), silver (Ag), and gold (Au).

The n$^+$-type drain region 22 is provided on the back surface side of the silicon carbide layer 10. The drain region 22 contains, for example, nitrogen (N) as the n-type impurity. For example, an n-type impurity concentration of the drain region 22 is equal to or more than $1 \times 10^{18}$ cm$^{-3}$ and is equal to or less than $1 \times 10^{21}$ cm$^{-3}$.

The n-type drift region 24 is provided on the drain region 22. The drift region 24 is provided between the drain region 22 and the front surface of the silicon carbide layer 10.

The drift region 24 functions as a current path when the MOSFET 100 is turned on. In addition, the drift region 24 has a function of maintaining a breakdown voltage of the MOSFET 100 by forming a depletion layer when the MOSFET 100 is turned off.

The drift region 24 contains, for example, nitrogen (N) as the n-type impurity. For example, an n-type impurity concentration of the drift region 24 is equal to or more than $1\times10^{16}$ cm$^{-3}$ and is equal to or less than $1\times10^{19}$ cm$^{-3}$. For example, a thickness of the drift region 24 in the third direction is equal to or more than 5 μm and is equal to or less than 150 μm.

The p-type body region 26 is provided between the drift region 24 and the front surface of the silicon carbide layer 10. The body region 26 is provided between two adjacent trenches 11. The body region 26 is provided between the first trench 11a and the second trench 11b.

The body region 26 is in contact with the gate insulating layer 14. The body region 26 functions as a channel region of the MOSFET 100. For example, when the MOSFET 100 is turned on, a channel through which electrons flow is formed in a region of the body region 26 in contact with the gate insulating layer 14.

The body region 26 contains, for example, aluminum (Al) as the p-type impurity. For example, a p-type impurity concentration of the body region 26 is equal to or more than $5\times10^{16}$ cm$^{-3}$ and is equal to or less than $5\times10^{17}$ cm$^{-3}$. For example, a depth of the body region 26 is equal to or more than 0.5 μm and is equal to or less than 1.0 μm.

The n$^{+}$-type source region 28 is provided between the body region 26 and the front surface of the silicon carbide layer 10. The source region 28 is in contact with the source electrode 16. The source region 28 is in contact with the trench 11. The source region 28 is the gate insulating layer 14.

For example, an n-type impurity concentration of the source region 28 is equal to or more than $1\times10^{19}$ cm$^{-3}$ and equal to or less than $1\times10^{21}$ cm$^{-3}$. A depth of the source region 28 is less than the depth of the body region 26. For example, the depth of the source region 28 is equal to or more than 0.1 μm and equal to or less than 0.6 μm. A distance between the drift region 24 and the source region 28 is, for example, is equal to or more than 0.1 μm and is equal to or less than 0.6 μm.

The p$^{+}$-type contact region 30 is provided between the body region 26 and the front surface of the silicon carbide layer 10. The contact region 30 is in contact with the source electrode 16. The contact region 30 is adjacent to the source region 28. The contact region 30 is in contact with the source region 28.

The contact region 30 has a function of reducing an electric resistance between the source electrode 16 and the body region 26.

The contact region 30 contains, for example, aluminum (Al) as the p-type impurity. A p-type impurity concentration of the contact region 30 is more than the p-type impurity concentration of the body region 26. For example, the p-type impurity concentration of the contact region 30 is equal to or more than $1\times10^{19}$ cm$^{-3}$ and is equal to or less than $1\times10^{22}$ cm$^{-3}$.

The p-type pillar region 32 is provided between the drift region 24 and the trench 11. The pillar regions 32 are repeatedly disposed in the second direction. The n-type drift region 24 is provided between two adjacent pillar regions 32.

The p-type pillar region 32 and the n-type drift region 24 are alternately arrayed in the second direction. The alternately arrayed p-type pillar region 32 and n-type drift region 24 form an SJ structure. The depletion layer extending in a lateral direction in the p-type pillar region 32 and the n-type drift region 24 relaxes electric field intensity in the silicon carbide layer 10 to realize a high breakdown voltage of the MOSFET 100. At the same time, a low on-resistance of the MOSFET 100 can be realized by increasing the impurity concentration of the n-type drift region 24.

The p-type pillar regions 32 are connected to the source electrode 16 at connection portions (not illustrated). An electric potential of the pillar region 32 is fixed to a source electric potential. The connection portions are disposed, for example, at predetermined intervals in the first direction.

The p-type first pillar region 32a is provided between the drift region 24 and the first trench 11a. The first pillar region 32a is provided between the drift region 24 and a bottom surface of the first trench 11a. The first pillar region 32a is in contact with the bottom surface of the first trench 11a.

The p-type second pillar region 32b is provided between the drift region 24 and the second trench 11b. The second pillar region 32b is provided between the drift region 24 and a bottom surface of the second trench. The second pillar region 32b is in contact with the bottom surface of the second trench.

The p-type third pillar region 32c is provided between the drift region 24 and the third trench 11c. The third pillar region 32c is provided between the drift region 24 and a bottom surface of the third trench 11c. The third pillar region 32c is in contact with the bottom surface of the third trench 11c.

A width (Wp in FIG. 1) of the pillar region 32 in the second direction is less than the width (Wt in FIG. 1) of the trench 11 in the second direction. The width Wp of the pillar region 32 in the second direction is, for example, equal to or less than 90% of the width Wt of the trench 11 in the second direction.

For example, the width (Wp in FIG. 1) of the first pillar region 32a in the second direction is less than the width (Wt in FIG. 1) of the first trench 11a in the second direction. The width Wp of the first pillar region 32a in the second direction is, for example, equal to or more than 50% and is equal to or less than 90% of the width Wt of the first trench 11a in the second direction.

The width (Wp in FIG. 1) of the pillar region 32 in the second direction is, for example, less than a width (Wg in FIG. 1) of the gate electrode 12 in the second direction. For example, the width (Wp in FIG. 1) of the first pillar region 32a in the second direction is less than the width (Wg in FIG. 1) of the first gate electrode 12a in the second direction.

The width (Wp in FIG. 1) of the pillar region 32 in the second direction is less than a width (Wn in FIG. 1) of the drift region 24 between two adjacent pillar regions 32. In other words, the width (Wp in FIG. 1) of the pillar region 32 in the second direction is less than an interval Wn between two adjacent pillar regions 32.

For example, the width (Wp in FIG. 1) of the first pillar region 32a in the second direction is less than the width (Wn in FIG. 1) of the drift region 24 between the first pillar region 32a and the second pillar region 32b. In other words, the width (Wp in FIG. 1) of the first pillar region 32a in the second direction is less than the interval Wn between the first pillar region 32a and the second pillar region 32b.

A length (d2 in FIG. 1) of the pillar region 32 in the third direction from the first face F1 to the second face F2 is more than the width (Wp in FIG. 1) of the pillar region 32 in the second direction. A length d2 of the pillar region 32 in the third direction from the first face F1 to the second face F2 is, for example, equal to or more than 5 times and is equal to or less than 200 times the width Wp of the pillar region 32 in the second direction. The length is preferably equal to or more than 10 times and is equal to or less than 100 times.

For example, the length (d2 in FIG. 1) of the first pillar region 32a in the third direction from the first face F1 to the second face F2 is more than the width (Wp in FIG. 1) of the first pillar region 32a in the second direction. The length d2 of the first pillar region 32a in the third direction from the first face F1 to the second face F2 is, for example, equal to or more than 5 times and is equal to or less than 200 times the width Wp of the first pillar region 32a in the second direction. The length is preferably equal to or more than 10 times and is equal to or less than 100 times.

The length (d2 in FIG. 1) of the pillar region 32 in the third direction is more than, for example, the length (d1 in FIG. 1) of the trench 11 in the third direction. The length d2 of the pillar region 32 in the third direction is, for example, equal to or more than 1.5 times the length d1 of the trench 11 in the third direction.

For example, the length (d2 in FIG. 1) of the first pillar region 32a in the third direction is more than the length (d1 in FIG. 1) of the first trench 11a in the third direction. The length d2 of the first pillar region 32a in the third direction is, for example, equal to or more than 1.5 times the length d1 of the first trench 11a in the third direction.

The pillar region 32 includes a low-concentration region 32x and a high-concentration region 32y. The high-concentration region 32y is provided between the trench 11 and the low-concentration region 32x. The high-concentration region 32y is in contact with the bottom surface of the trench 11.

For example, the first pillar region 32a includes a low-concentration region 32x and a high-concentration region 32y. The high-concentration region 32y is provided between the first trench 11a and the low-concentration region 32x. The high-concentration region 32y is in contact with the bottom surface of the first trench 11a.

A length (d4 in FIG. 1) of the high-concentration region 32y in the third direction is less than a length (d3 in FIG. 1) of the low-concentration region 32x in the third direction.

A p-type impurity concentration of the high-concentration region 32y is more than a p-type impurity concentration of the low-concentration region 32x. A p-type impurity concentration of the high-concentration region 32y is, for example, equal to or more than 10 times a p-type impurity concentration of the low-concentration region 32x.

The pillar region 32 contains, for example, aluminum (Al) as the p-type impurity. The low-concentration region 32x and the high-concentration region 32y contain, for example, aluminum (Al) as the p-type impurity.

The p-type impurity concentration of the low-concentration region 32x is more than, for example, $1 \times 10^{17}$ cm$^{-3}$. For example, the p-type impurity concentration of the low-concentration region 32x is equal to or more than $1 \times 10^{18}$ cm$^{-3}$ and is equal to or less than $5 \times 10^{19}$ cm$^{-3}$.

The p-type impurity concentration of the high-concentration region 32y is more than, for example, $1 \times 10^{20}$ cm$^{-3}$. For example, the p-type impurity concentration of the high-concentration region 32y is equal to or more than $1 \times 10^{21}$ cm$^{-3}$ and is equal to or less than $5 \times 10^{22}$ cm$^{-3}$.

For example, when the width of the pillar region 32 in the second direction is Wp, the p-type impurity concentration of the low-concentration region 32x of the pillar region 32 is N1, the width of the drift region 24 between two adjacent pillar regions 32 is Wn, and the n-type impurity concentration of the drift region 24 between two adjacent pillar regions 32 is N2, a relationship of the following Expression is satisfied.

$$0.8 < (Wp \times N1)/(Wn \times N2) \leq 1.2$$

Next, an example of a method of manufacturing a semiconductor device of the first embodiment will be described.

A method of manufacturing a semiconductor device of a first embodiment includes forming a mask material having an opening in a front surface of a silicon carbide layer, forming a trench in the silicon carbide layer by using the mask material as a mask, performing first ion implantation for implanting carbon (C) up to a region where a depth from a bottom surface of the trench is more than a depth of the trench in the bottom surface by using the mask material as a mask, forming a sidewall material in a side surface of the trench, performing second ion implantation for implanting a p-type impurity up to the region where the depth from the bottom surface of the trench is more than the depth of the trench in the bottom surface by using the mask material as the mask, and performing a heat treatment at a temperature equal to or more than 1600° C.

FIGS. 4, 5, 6, 7, 8, 9, 10, and 11 are explanatory diagrams of the method of manufacturing a semiconductor device of the first embodiment. FIGS. 4 to 11 are schematic cross-sectional views illustrating a semiconductor device in the middle of manufacturing. FIGS. 4 to 11 illustrate cross sections corresponding to FIG. 1.

Figure 4:
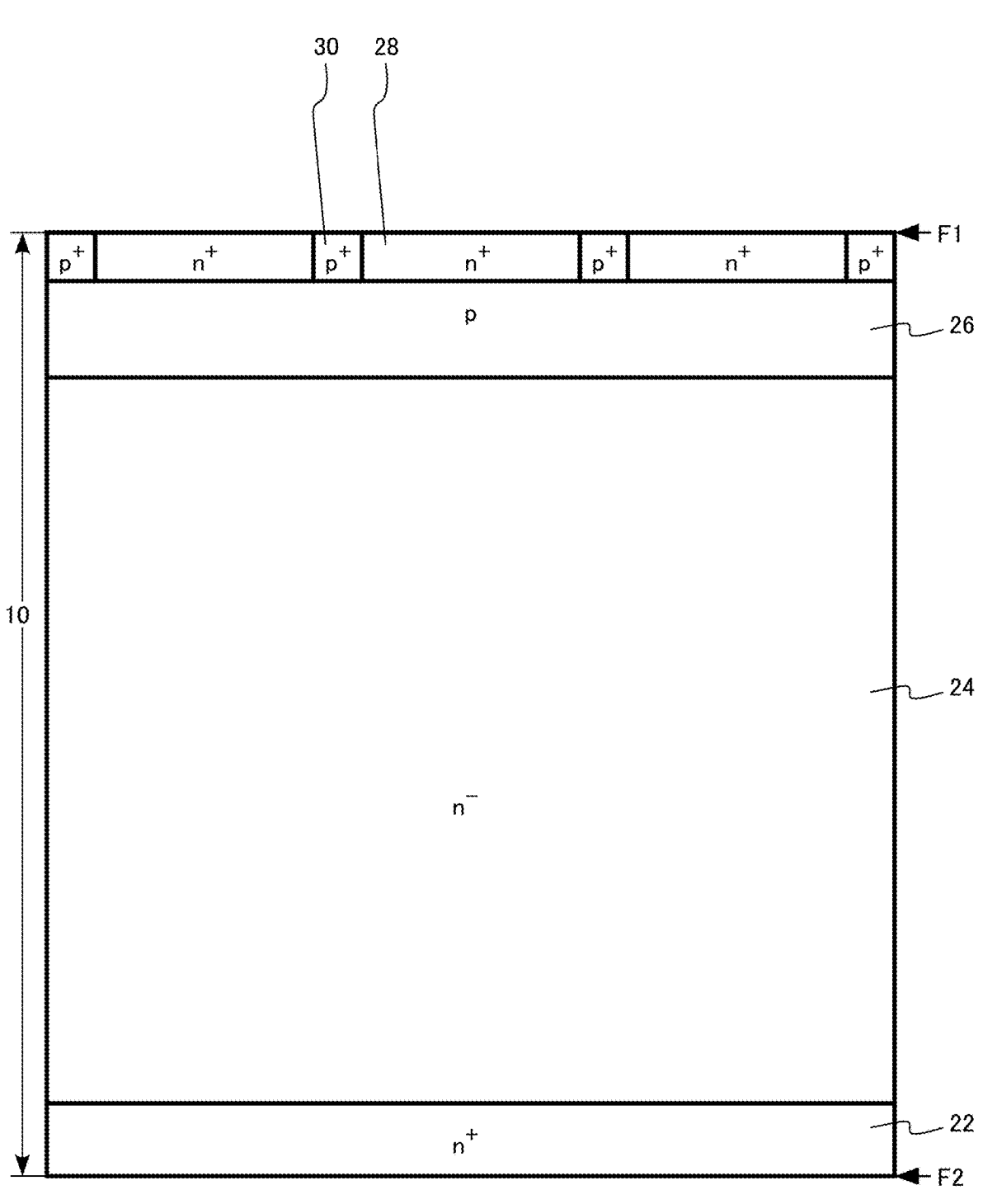
FIG. 4 is an explanatory diagram of a method of manufacturing a semiconductor device of the first embodiment.

First, the silicon carbide layer 10 having the first face F1 (front surface) which is the silicon face and the second face F2 (back surface) which is the carbon face is prepared (FIG. 4). In the silicon carbide layer 10, the n$^+$-type drain region 22, the n-type drift region 24, the p-type body region 26, the n$^+$-type source region 28, and the p$^+$-type contact region 30 are formed.

The drift region 24 is formed on the drain region 22 by, for example, an epitaxial growth method. The body region 26, the source region 28, and the contact region 30 are formed, for example, on the front surface of the drift region 24 by using an ion implantation method.

Figure 5:
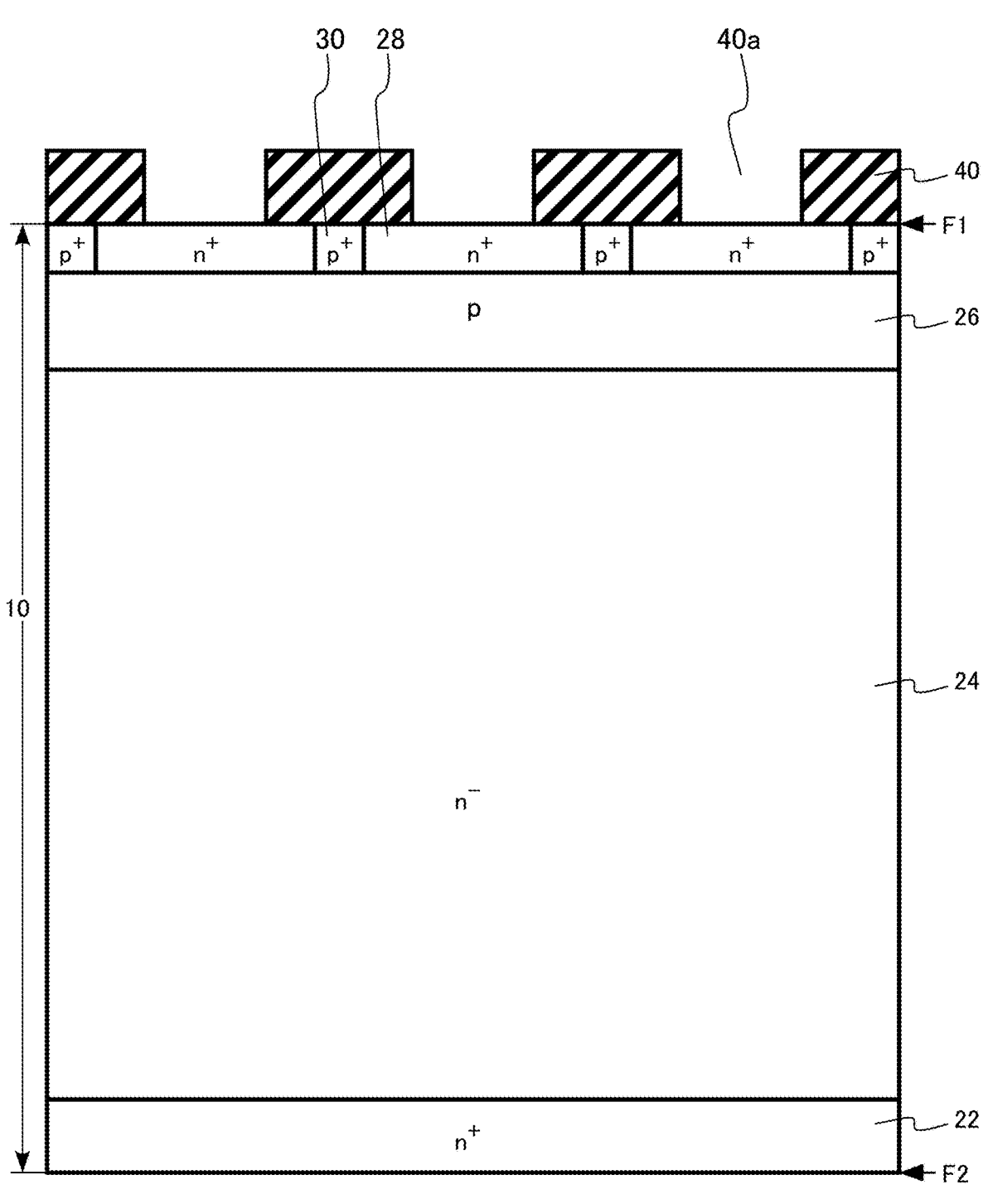
FIG. 5 is an explanatory diagram of the method of manufacturing a semiconductor device of the first embodiment.

Subsequently, a mask material 40 having an opening 40a on the front surface of the silicon carbide layer 10 is formed (FIG. 5). The mask material 40 is, for example, an insulator. The mask material 40 is, for example, a silicon nitride.

The mask material 40 is formed by, for example, depositing an insulating film and patterning the insulating film by photolithography and etching.

Figure 6:
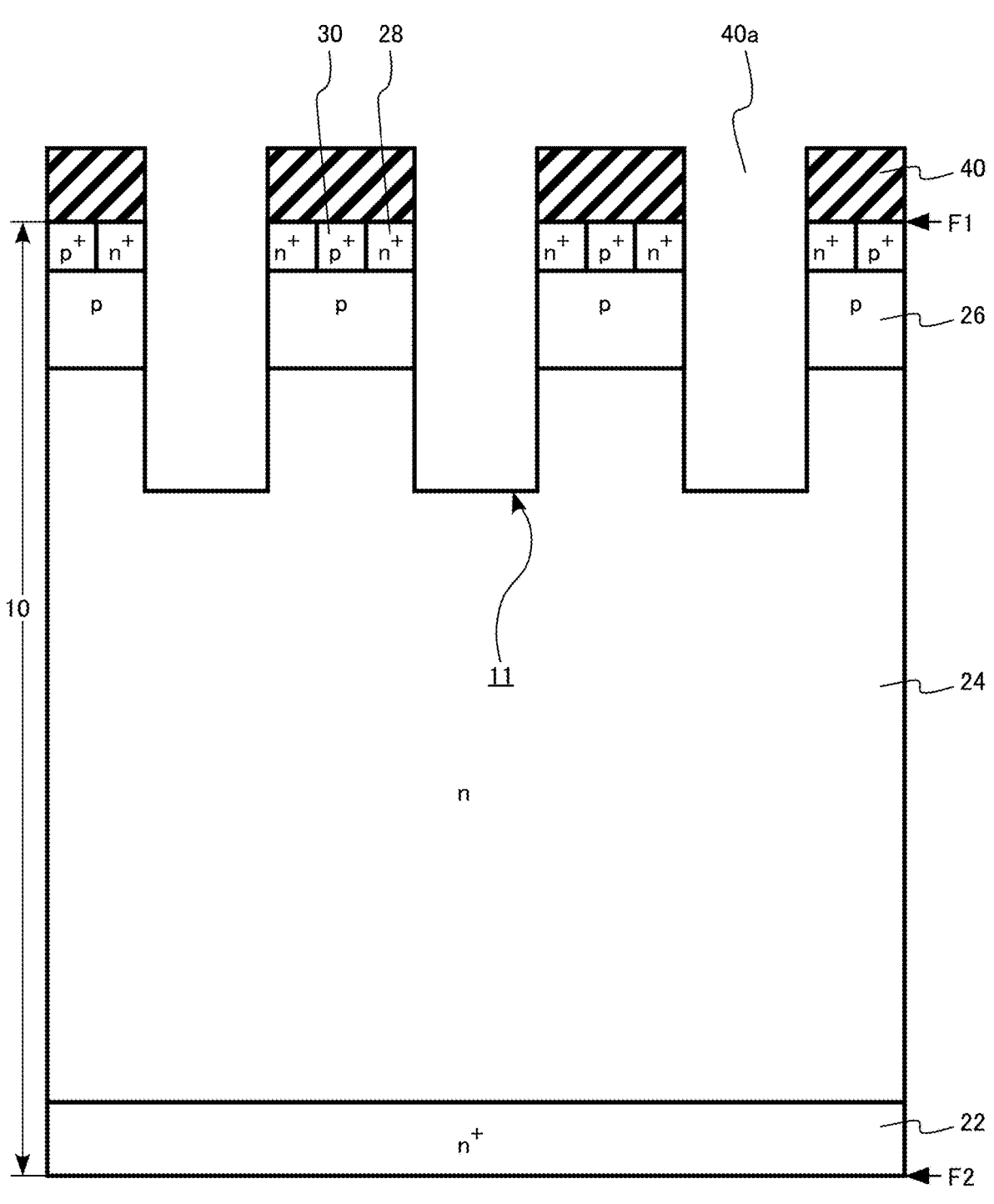
FIG. 6 is an explanatory diagram of the method of manufacturing a semiconductor device of the first embodiment.

Subsequently, the trench 11 is formed in the silicon carbide layer 10 by using the mask material 40 as an etching mask (FIG. 6). The trench 11 is formed by, for example, using a reactive ion etching method (RIE method).

Figure 7:
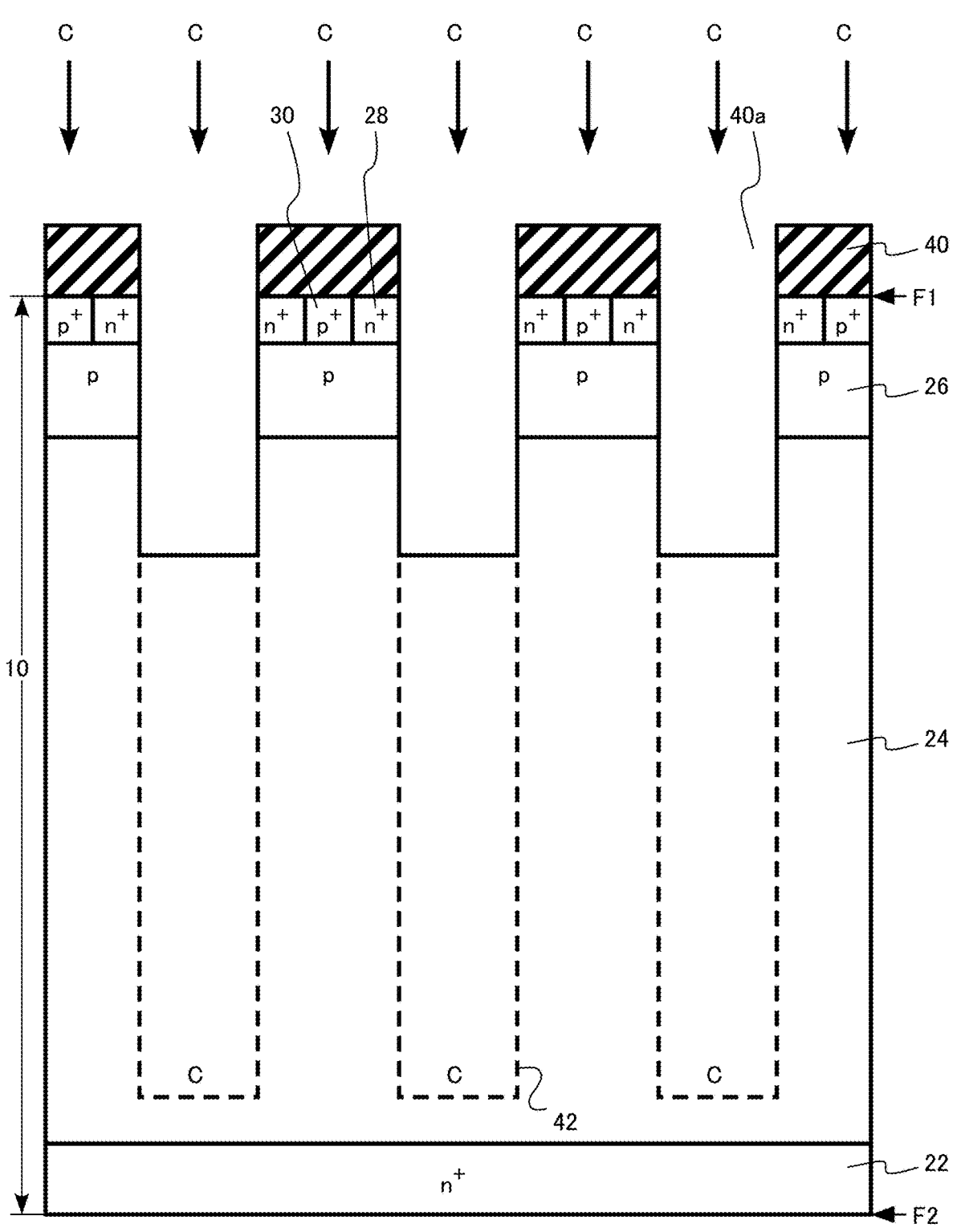
FIG. 7 is an explanatory diagram of the method of manufacturing a semiconductor device of the first embodiment.

Subsequently, first ion implantation for implanting carbon (C) into the bottom surface of the trench 11 is performed by using the mask material 40 as an ion implantation mask (FIG. 7). A carbon region 42 is formed in the silicon carbide layer 10 by the first ion implantation.

In the first ion implantation, carbon (C) is implanted up to a region where a depth from the bottom surface of the trench 11 is more than the depth of the trench 11. A depth of the carbon region 42 from the first face F1 is equal to or more than twice the depth of the trench 11 from the first face F1.

The first ion implantation is performed, for example, a plurality of times while an accelerating voltage is changed.

The first ion implantation is performed, for example, at a temperature equal to or more than 10000 and equal to or less than 1300° C. The first ion implantation is performed, for example, in a state where a temperature of the silicon carbide layer 10 is equal to or more than 1000° C. and is equal to or less than 1300° C.

Subsequently, a sidewall material 44 is formed on the side surface of the trench 11. The sidewall material 44 is, for example, an insulator. The sidewall material 44 is, for example, a silicon oxide.

The bottom surface of the trench 11 is exposed at a bottom of the sidewall material 44. The sidewall material 44 is formed by, for example, deposition of an insulating film and etching using a RIE method.

Figure 8:
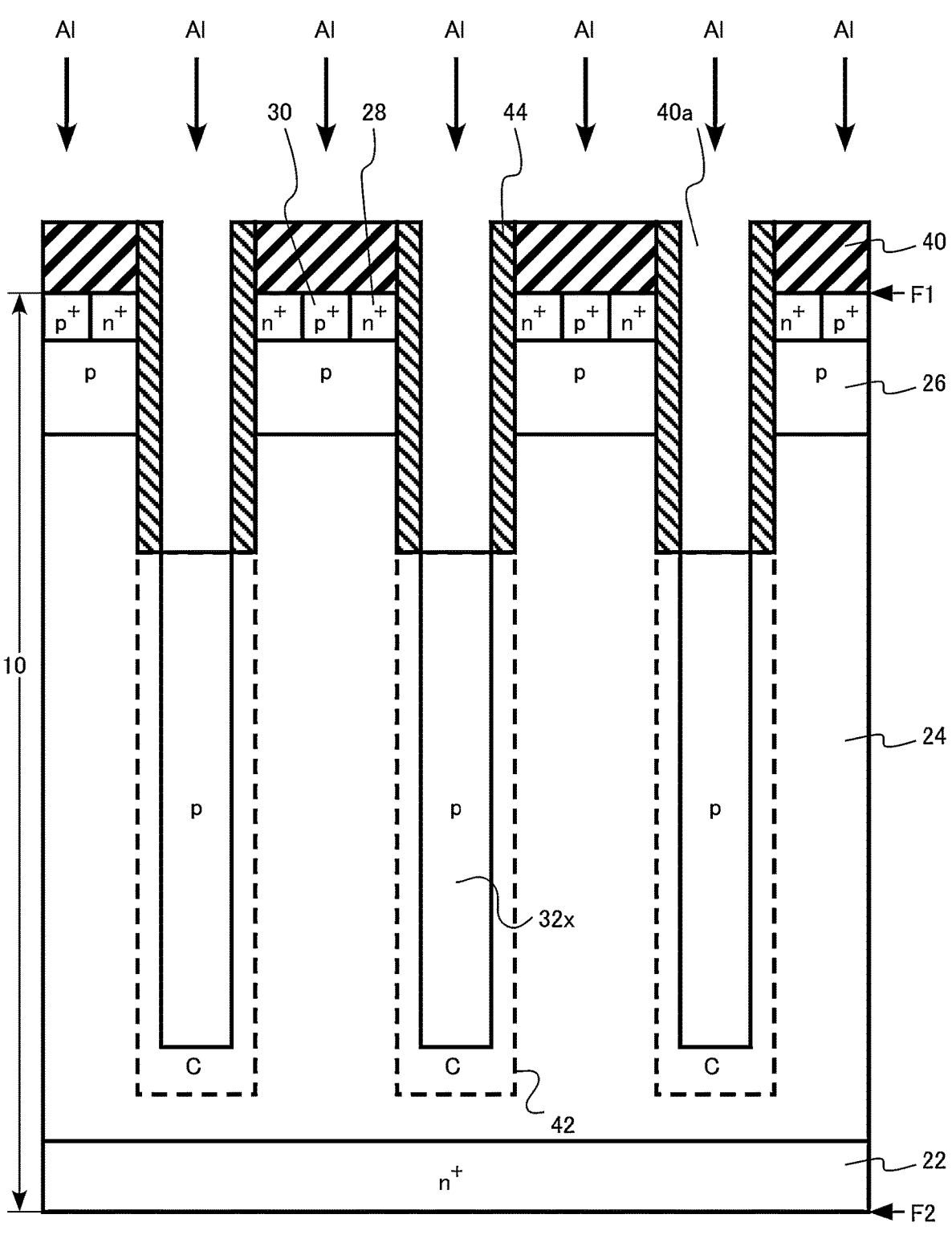
FIG. 8 is an explanatory diagram of the method of manufacturing a semiconductor device of the first embodiment.

Subsequently, second ion implantation for implanting aluminum (Al) into the bottom surface of the trench 11 is performed by using the mask material 40 and the sidewall material 44 as ion implantation masks (FIG. 8). The low-concentration region $32x$ of the p-type pillar region 32 is formed by the second ion implantation. Aluminum (Al) implanted by the second ion implantation is an example of first impurity.

In the second ion implantation, aluminum (Al) is implanted up to a region where the depth from the bottom surface of the trench 11 is more than the depth of the trench 11. A depth of the low-concentration region $32x$ from the first face F1 is equal to or more than twice the depth of the trench 11 from the first face F1.

The second ion implantation is performed, for example, a plurality of times while an accelerating voltage is changed.

The second ion implantation is performed, for example, at a temperature of equal to or more than 1000° C. and equal to or less than 1300° C. The second ion implantation is performed, for example, in a state where the temperature of the silicon carbide layer 10 is equal to or more than 1000° C. and is equal to or less than 1300° C.

A maximum concentration of carbon in the silicon carbide layer 10 implanted by the first ion implantation is, for example, more than a maximum concentration of aluminum in the silicon carbide layer 10 implanted by the second ion implantation.

A dose amount of carbon in the first ion implantation is, for example, equal to or more than 10 times a dose amount of aluminum in the second ion implantation. In order to prevent diffusion of an impurity into an outer region of the pillar region 32, the dose amount of carbon in the first ion implantation implanted into the carbon region 42 is more than 10 times, preferably equal to or more than 100 times, and more preferably equal to or more than 1000 times the amount of carbon deficiency in the drift region 24. The amount of carbon deficiency in the drift region 24 formed by epitaxial growth is estimated to be equal to or less than $1 \times 10^{14}\, \mathrm{cm}^{-3}$. Thus, the dose amount of carbon in the first ion implantation is equal to or more than $1 \times 10^{15}\, \mathrm{cm}^{-3}$, preferably equal to or more than $1 \times 10^{16}\, \mathrm{cm}^{-3}$, and more preferably equal to or more than $1 \times 10^{17}\, \mathrm{cm}^{-3}$.

For example, a distribution of carbon implanted into silicon carbide layer 10 by the first ion implantation in the silicon carbide layer 10 before a heat treatment covers a distribution of aluminum implanted into the silicon carbide layer 10 by the second ion implantation in the silicon carbide layer 10 before the heat treatment. For example, the distribution of aluminum (Al) implanted by the second ion implantation in the silicon carbide layer 10 is included in the carbon region 42, for example, as illustrated in FIG. 8.

Figure 9:
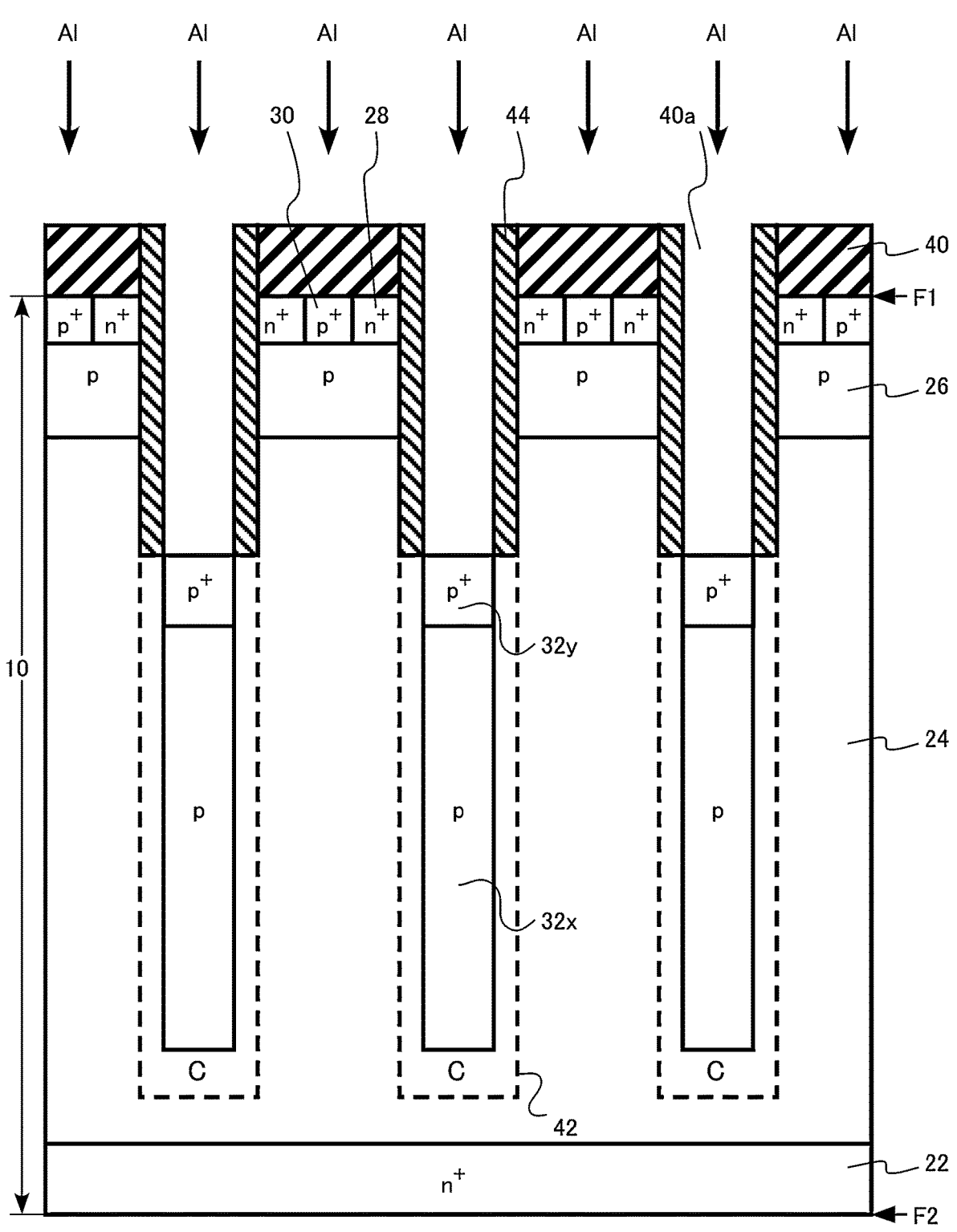
FIG. 9 is an explanatory diagram of the method of manufacturing a semiconductor device of the first embodiment.

Subsequently, third ion implantation for implanting aluminum (Al) into the bottom surface of the trench 11 is performed by using the mask material 40 and the sidewall material 44 as ion implantation masks (FIG. 9). The high-concentration region $32y$ of the p-type pillar region 32 is formed by the third ion implantation. Aluminum (Al) implanted by the third ion implantation is an example of second impurity.

In the third ion implantation, aluminum (Al) is implanted up to a region where the depth from the bottom surface of the trench 11 is less than the depth of the trench 11. A depth of the high-concentration region $32y$ from the first face F1 is equal to or less than twice the depth of the trench 11 from the first face F1.

The third ion implantation is performed, for example, at a temperature equal to or more than 1000° C. and equal to or less than 1300° C. The third ion implantation is performed, for example, in a state where the temperature of the silicon carbide layer 10 is equal to or more than 1000° C. and equal to or less than 1300° C.

The maximum concentration of carbon in the silicon carbide layer 10 implanted by the first ion implantation is, for example, more than a maximum concentration of aluminum in the silicon carbide layer 10 implanted by the third ion implantation.

For example, the distribution of carbon implanted into the silicon carbide layer 10 by the first ion implantation in the silicon carbide layer 10 before the heat treatment covers a distribution of aluminum implanted into the silicon carbide layer 10 by the third ion implantation in the silicon carbide layer 10 before the heat treatment. For example, the distribution of aluminum (Al) implanted by the third ion implantation in the silicon carbide layer 10 is included in the carbon region 42, for example, as illustrated in FIG. 9.

Subsequently, the mask material 40 and the sidewall material 44 are removed. The mask material 40 and the sidewall material 44 are removed by, for example, etching using a wet etching method.

Subsequently, a carbon film 46 is formed on the front surface of the silicon carbide layer 10.

Figure 10:
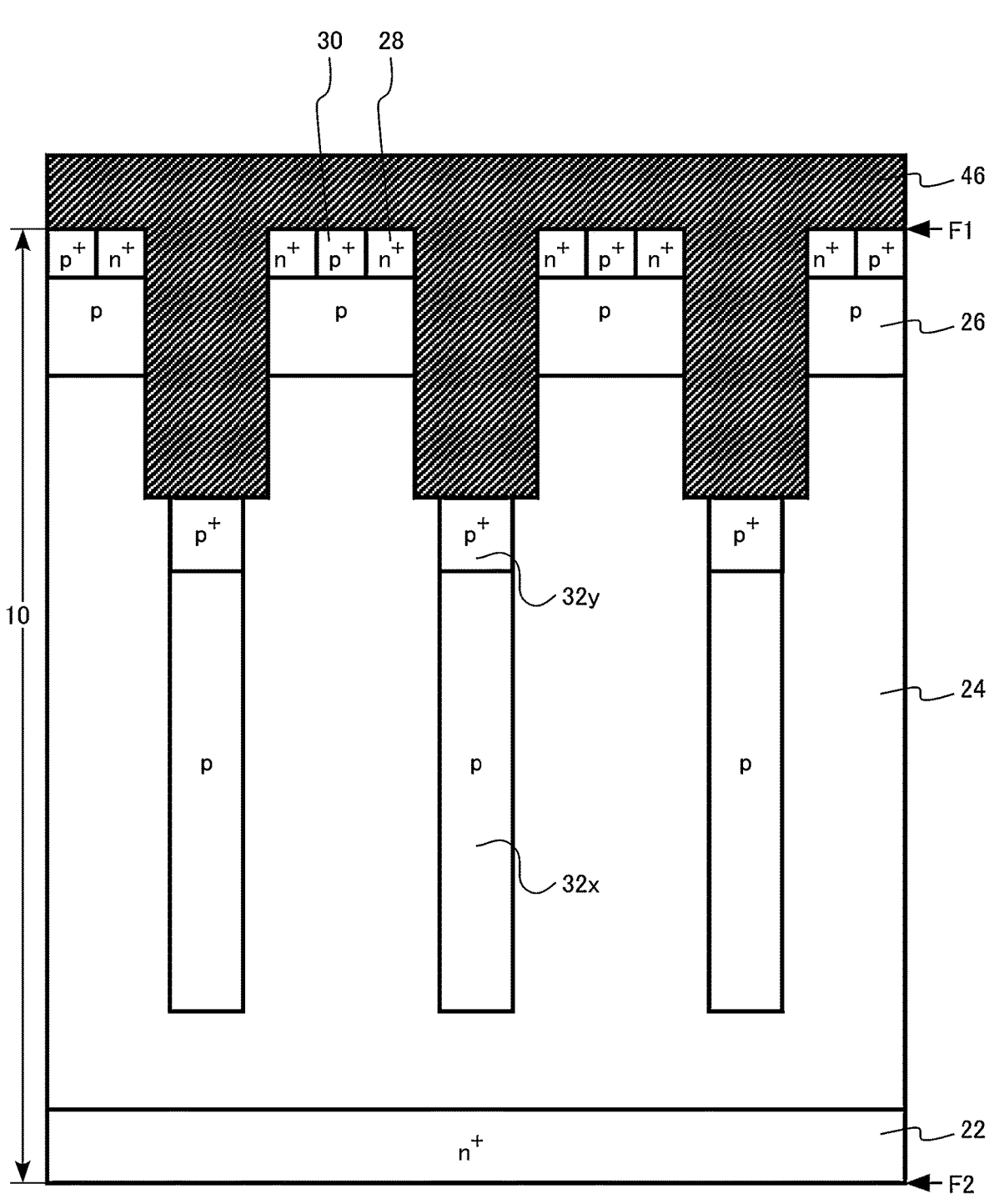
FIG. 10 is an explanatory diagram of the method of manufacturing a semiconductor device of the first embodiment.

Subsequently, a heat treatment is performed (FIG. 10). The heat treatment is performed, for example, at a temperature equal to or more than 1600° C. and equal to or less than 2000° C. The heat treatment is performed in a non-oxidizing atmosphere. The heat treatment is performed, for example, in an inert gas atmosphere. The heat treatment is performed, for example, in an argon gas atmosphere.

By the heat treatment, aluminum ion-implanted into the silicon carbide layer 10 is activated. The heat treatment is activation annealing of aluminum. In addition, interstitial carbon formed by carbon ion implantation into the silicon carbide layer 10 by the heat treatment fills carbon vacancies in the silicon carbide layer 10.

The carbon film 46 suppresses desorption of silicon and carbon from the silicon carbide layer 10 into the atmosphere during the heat treatment. In addition, the carbon film 46 absorbs excessive interstitial carbon in the silicon carbide layer 10 during the heat treatment.

Figure 11:
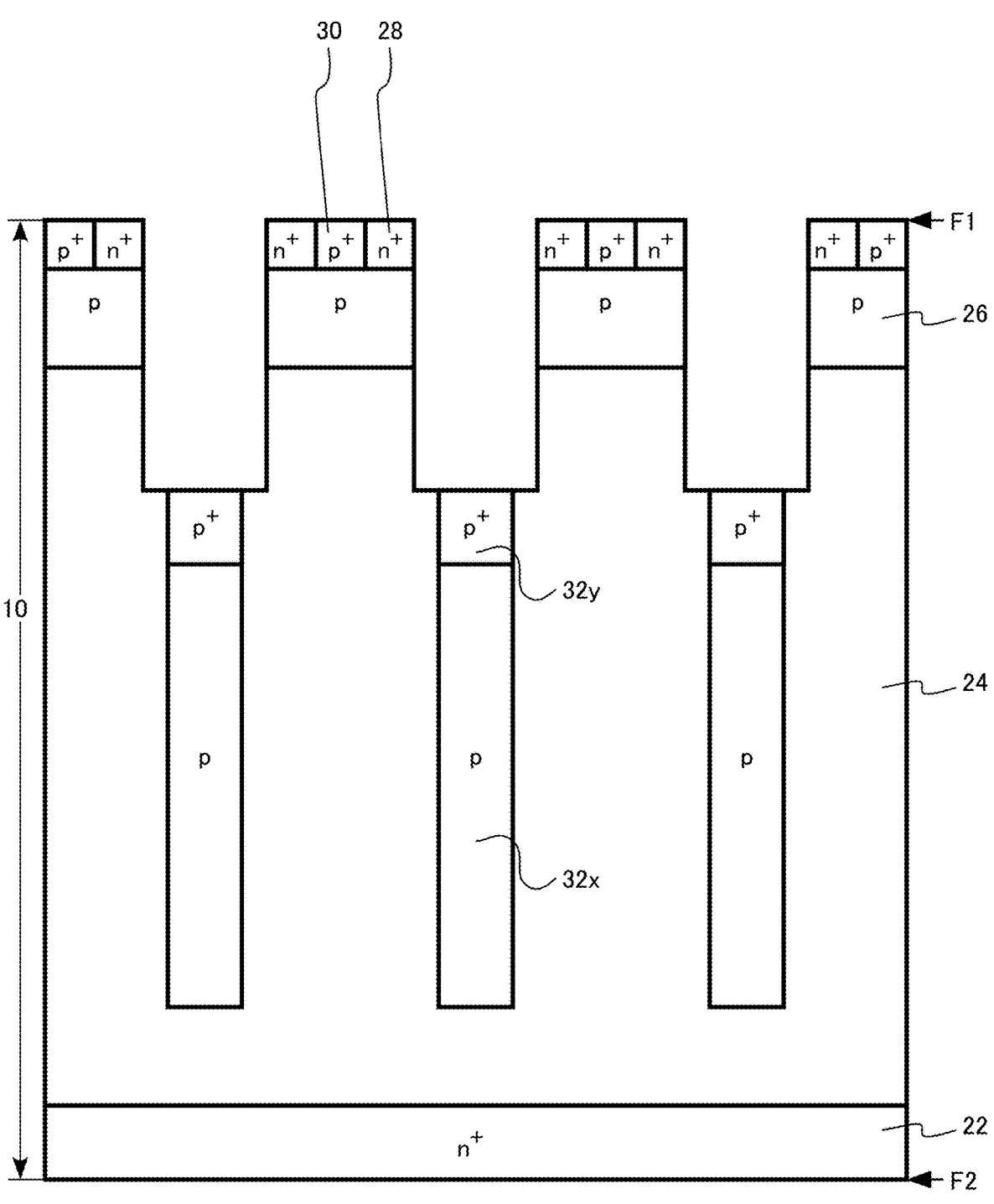
FIG. 11 is an explanatory diagram of the method of manufacturing a semiconductor device of the first embodiment.

Subsequently, the carbon film 46 is removed (FIG. 11). Thereafter, the gate insulating layer 14 and the gate electrode 12 are formed inside the trench 11 by using a known process technique. Further, the interlayer insulating layer 20 and the source electrode 16 are formed on the front surface of the silicon carbide layer 10. Further, the drain electrode 18 is formed on the back surface of the silicon carbide layer 10.

The MOSFET 100 illustrated in FIGS. 1 and 2 is manufactured by the above manufacturing method.

Next, functions and effects of the semiconductor device and the method of manufacturing a semiconductor device of the first embodiment will be described.

According to the MOSFET 100 of the first embodiment, it is possible to reduce an on-resistance and improve reliability. Details will be described below.

A trench-gate structure in which the gate electrode is provided in the trench is applied to the MOSFET 100. Due to the application of the trench-gate structure, a channel area per unit area is increased, and thus, an on-resistance of the MOSFET 100 is reduced.

In addition, in the MOSFET 100, the p-type pillar region 32 and the n-type drift region 24 are alternately arrayed in the second direction. The alternately arrayed p-type pillar region 32 and n-type drift region 24 form an SJ structure. The depletion layer extending in a lateral direction in the p-type pillar region 32 and the n-type drift region 24 relaxes electric field intensity in the silicon carbide layer 10 to realize a high breakdown voltage of the MOSFET 100. At the same time, the on-resistance of the MOSFET 100 is reduced by increasing the n-type impurity concentration of the n-type drift region 24.

In addition, the MOSFET 100 has the p-type pillar region 32 at the bottom of the trench 11. By having the p-type pillar region 32, an electric field applied to the gate insulating layer 14 at the bottom of the trench 11 is relaxed when the MOSFET 100 is turned off. Thus, the reliability of the gate insulating layer 14 is improved.

In addition, the MOSFET 100 includes the high-concentration region 32$y$ in which the pillar region 32 is in contact with the bottom surface of the trench 11 and the p-type impurity concentration is high. By including the high-concentration region 32$y$ having a high p-type impurity concentration, the electric field applied to the gate insulating layer 14 at the bottom of the trench 11 is further relaxed. Thus, the reliability of the gate insulating layer 14 is further improved.

In addition, in the MOSFET 100, the pillar region 32 includes the high-concentration region 32$y$ having a high p-type impurity concentration, and thus, an electric resistance of the pillar region 32 in the first direction is reduced. For example, the p-type pillar regions 32 are connected to the source electrode 16 at the connection portions (not illustrated). The connection portions are disposed, for example, at predetermined intervals in the first direction. The electric resistance of the pillar region 32 in the first direction is reduced, and thus, for example, a disposing interval of the connection portions can be lengthened. Accordingly, an area of the connection portion per unit area can be reduced. Accordingly, a channel area per unit area of the MOSFET 100 increases, and the on-resistance of the MOSFET 100 can be reduced.

In the MOSFET 100, the width (Wp in FIG. 1) of the pillar region 32 in the second direction is less than the width (Wt in FIG. 1) of the trench 11 in the second direction. The width of the pillar region 32 in the second direction (Wp in FIG. 1) is less than the width of the trench 11 in the second direction (Wt in FIG. 1), and thus, for example, the interval (St in FIGS. 1 and 2) between two adjacent trenches 11 can be reduced. Accordingly, the channel area per unit area increases, and an on-resistance of the MOSFET 100 can be further reduced.

From the viewpoint of reducing the on-resistance of the MOSFET 100, the width Wp of the pillar region 32 in the second direction is preferably equal to or less than 90%, and more preferably equal to or less than 80% of the width Wt of the trench 11 in the second direction.

From the viewpoint of reducing the on-resistance of the MOSFET 100, the width (Wp in FIG. 1) of the pillar region 32 in the second direction is preferably less than the width (Wg in FIG. 1) of the gate electrode 12 in the second direction.

From the viewpoint of improving the breakdown voltage of the MOSFET 100, the length d2 of the pillar region 32 in the third direction from the first face F1 to the second face F2 is preferably equal to or more than 5 times, more preferably equal to or more than 10 times the width Wp of the pillar region 32 in the second direction.

From the viewpoint of improving the breakdown voltage of the MOSFET 100, the length (d2 in FIG. 1) of the pillar region 32 in the third direction is preferably more than the length (d1 in FIG. 1) of the trench 11 in the third direction, more preferably equal to or more than 1.5 times the length d1 of the trench 11 in the third direction, and still more preferably equal to or more than 2 times the length d1 of the trench 11 in the third direction.

From the viewpoint of effectively functioning the SJ structure of the MOSFET 100, when the width of the pillar region 32 in the second direction is Wp, the p-type impurity concentration of the low-concentration region 32$x$ of the pillar region 32 is N1, the width of the drift region 24 between two adjacent pillar regions 32 is Wn, and the n-type impurity concentration of the drift region 24 between two adjacent pillar regions 32 is N2, a relationship of the following Expression is preferable satisfied.

$$0.8 < (Wp \times N1)/(Wn \times N2) \le 1.2$$

Figure 12:
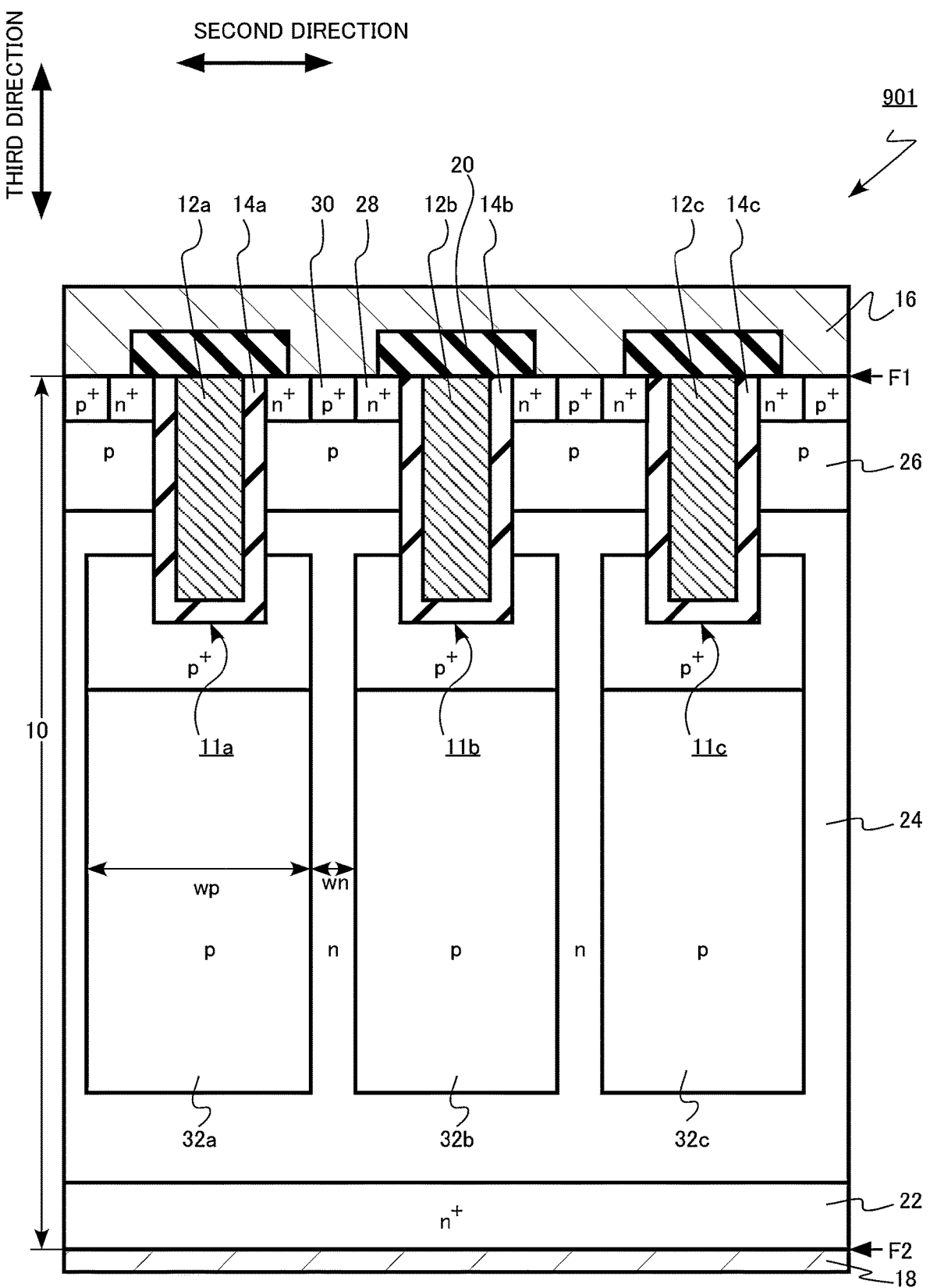
FIG. 12 is a schematic cross-sectional view of a semiconductor device of a comparative example.

FIG. 12 is a schematic cross-sectional view of a semiconductor device of a comparative example. FIG. 12 is a diagram corresponding to FIG. 1.

The semiconductor device of the comparative example is a vertical MOSFET 901 of trench gate type using silicon carbide. The MOSFET 901 is a MOSFET of n-channel type using electrons as carriers.

The MOSFET 901 of the comparative example is a MOSFET manufactured by a manufacturing method different from the method of manufacturing a semiconductor device of the first embodiment. The MOSFET 901 of the comparative example is manufactured without performing the first ion implantation included in the method of manufacturing a semiconductor of the first embodiment. In the first ion implantation, carbon (C) is implanted into the bottom surface of the trench.

In the MOSFET 901 of the comparative example, the width (Wp in FIG. 12) of the pillar region 32 in the second direction is more than the width of the trench 11 in the second direction. In the MOSFET 901 of the comparative example, the interval (Wn in FIG. 12) between the adjacent pillar regions 32 in the second direction is less than in the MOSFET 100 of the first embodiment. In addition, in the MOSFET 901 of the comparative example, the distance between the pillar region 32 and the body region 26 in the third direction is less than in the MOSFET 100 of the first embodiment.

When the interval Wn between adjacent pillar regions 32 in the second direction decreases, a current path flowing through the drift region 24 is narrowed when the MOSFET is turned on. In addition, when the distance between the pillar region 32 and the body region 26 in the third direction decreases, the current path flowing through the drift region 24 is narrowed when the MOSFET is turned on. Accordingly, the on-resistance of the MOSFET increases. In addition, when Al in the pillar region 32 diffuses and reaches the body region 26, that is, when the distance between the pillar region 32 and the body region 26 in the third direction becomes zero, an operation of the MOSFET becomes difficult.

In addition, when the distance between the pillar region 32 and the body region 26 in the third direction decreases, there is a concern that a threshold voltage of the MOSFET fluctuates due to a fluctuation of the third distance.

For example, when the diffusion of aluminum in the pillar regions 32 can be suppressed, the interval Wn between adjacent pillar regions 32 in the second direction and the distance between the pillar regions 32 and the body region 26 in the third direction are increased, and the on-resistance of the MOSFET can be reduced.

In the method of manufacturing a semiconductor device of the first embodiment, carbon (C) is introduced into a range wider than a range in which impurities are ion-implanted by ion implantation. By the above method, a carbon vacancy density in the silicon carbide layer 10 is reduced, and diffusion of impurities ion-implanted into the silicon carbide layer 10 due to a heat treatment can be suppressed.

The diffusion of impurities in the silicon carbide layer 10 is promoted by the carbon vacancies in the silicon carbide layer 10. In the method of manufacturing a semiconductor device of the first embodiment, the carbon region 42 is formed by ion implantation of carbon, and thus, the carbon vacancy density in the silicon carbide layer 10 is reduced. Accordingly, the diffusion of impurities is suppressed, and the diffusion of aluminum in the pillar region 32 can be suppressed.

In particular, in the method of manufacturing a semiconductor device of the first embodiment, carbon is ion-implanted into the bottom surface of the trench 11 by the first ion implantation to form the carbon region 42, and then the second ion implantation is performed by using the sidewall material 44 as the mask to ion-implant aluminum into the bottom surface of the trench 11. Thus, at least in the second direction, the distribution of aluminum is covered with the carbon region 42.

In the method of manufacturing a semiconductor device of the first embodiment, the carbon region 42 is formed in a region where diffusion of aluminum in the lateral direction is scheduled before the heat treatment for diffusing aluminum. Accordingly, the diffusion of aluminum in the lateral direction is effectively suppressed.

Accordingly, according to the method of manufacturing a semiconductor device of the first embodiment, the MOSFET 100 in which the interval Wn between adjacent pillar regions 32 in the second direction and the distance between the pillar regions 32 and the body region 26 in the third direction are large can be manufactured as compared with the MOSFET 901 of the comparative example. Thus, the MOSFET 100 that can reduce the on-resistance can be manufactured. Further, in the MOSFET 100, the distance between the pillar region 32 and the body region 26 in the third direction increases, and thus, a fluctuation of the threshold voltage is suppressed.

In addition, the diffusion of aluminum in the pillar region 32 can be suppressed, and thus, the p-type impurity concentration of the pillar region 32 can be increased. Thus, the electric resistance of the pillar region 32 is reduced. Accordingly, for example, when the MOSFET 100 is turned off, the discharge of holes from the pillar regions 32 is promoted. Thus, a switching loss of the MOSFET 100 can be reduced.

In the MOSFET 100, the pillar regions 32 are connected to the source electrode 16 at any position in the first direction. For example, the pillar regions 32 are connected to the source electrode 16 by providing the connection portions. In the MOSFET 100, since the p-type impurity concentration of the pillar region 32 can be increased, the electric resistance of the pillar region 32 in the first direction is reduced, and the interval between the connection portions can be widened.

In addition, the p-type impurity concentration in the high-concentration region 32$y$ of the pillar region 32 is increased, and thus, the electric field applied to the gate insulating layer 14 at the bottom of the trench 11 is further relaxed when the MOSFET 100 is turned off. Thus, the reliability of the gate insulating layer 14 of the MOSFET 100 is further improved.

The first ion implantation for implanting carbon is preferably performed at a temperature equal to or more than 1000° C. Carbon is introduced into the silicon carbide layer 10 at a temperature equal to or more than 1000° C., interstitial carbon enters the carbon vacancies during ion implantation, and the carbon vacancy density can be reduced. Accordingly, for example, the diffusion of impurities when the subsequent ion implantation of impurities is performed at a high temperature can be suppressed.

In addition, the ion implantation of carbon at a temperature equal to or more than 1000° C. can reduce damage due to the ion implantation of carbon. Accordingly, the reliability of the MOSFET 100 is improved.

The second ion implantation for implanting aluminum (Al) is preferably performed at a temperature equal to or more than 1000° C. Impurities are ion-implanted at a temperature equal to or more than 1000° C., and thus, the damage due to the ion implantation of the impurities can be reduced. Since amorphization of the silicon carbide layer 10 due to damage can be suppressed and crystallinity can be maintained high, activation efficiency after the activation annealing can be increased. Since the crystallinity of the silicon carbide layer 10 can be maintained more as a temperature of the ion implantation is more, the temperature of the ion implantation is more preferably equal to or more than 1100° C.

From the viewpoint of suppressing degradations of the mask material 40 and the sidewall material 44 due to heat, the temperatures of the first ion implantation and the second ion implantation are preferably equal to or less than 1300° C., and more preferably 1200° C.

Since the carbon region 42 is formed by the first ion implantation of carbon prior to the second ion implantation of aluminum, the diffusion of impurities due to ion implantation at a high temperature can be suppressed.

From the viewpoint of suppressing the diffusion of aluminum, the maximum concentration of carbon in the silicon carbide layer 10 implanted by the first ion implantation is preferably more than the maximum concentration of aluminum in the silicon carbide layer 10 implanted by the second ion implantation.

From the viewpoint of suppressing the diffusion of aluminum, the dose amount of carbon in the first ion implantation is preferably equal to or more than 10 times, more preferably equal to or more than 100 times the dose amount of aluminum in the second ion implantation.

From the viewpoint of suppressing the diffusion of aluminum, the distribution of carbon implanted into the silicon carbide layer 10 by the first ion implantation in the silicon carbide layer 10 before the heat treatment preferably covers the distribution of aluminum implanted into the silicon carbide layer 10 by the second ion implantation in the silicon carbide layer 10 before the heat treatment.

The temperature of the heat treatment is preferably equal to or more than 1850° C. The heat treatment is performed at a temperature equal to or more than 1850° C., and thus, activation efficiency of impurities is improved. Since the carbon region 42 is formed by the first ion implantation of carbon prior to the second ion implantation of aluminum, the diffusion of aluminum can be suppressed even when the heat treatment is equal to or more than 1850° C.

In the third ion implantation, it is also preferable to adopt the same conditions as the conditions of the second ion implantation.

As described above, according to the semiconductor device and the method of manufacturing a semiconductor device of the first embodiment, it is possible to reduce the on-resistance.

Second Embodiment

A semiconductor device of a second embodiment is different from the semiconductor device of the first embodiment in further including a plurality of p-type sixth silicon carbide regions disposed in the silicon carbide layer, in contact with the fourth silicon carbide region, disposed between the first silicon carbide region and the first trench, between the second silicon carbide region and the first trench, and between the third silicon carbide region and the first trench, and repeatedly disposed in the first direction. Hereinafter, a part of contents overlapping the contents of the first embodiment will not be described.

Figure 13:
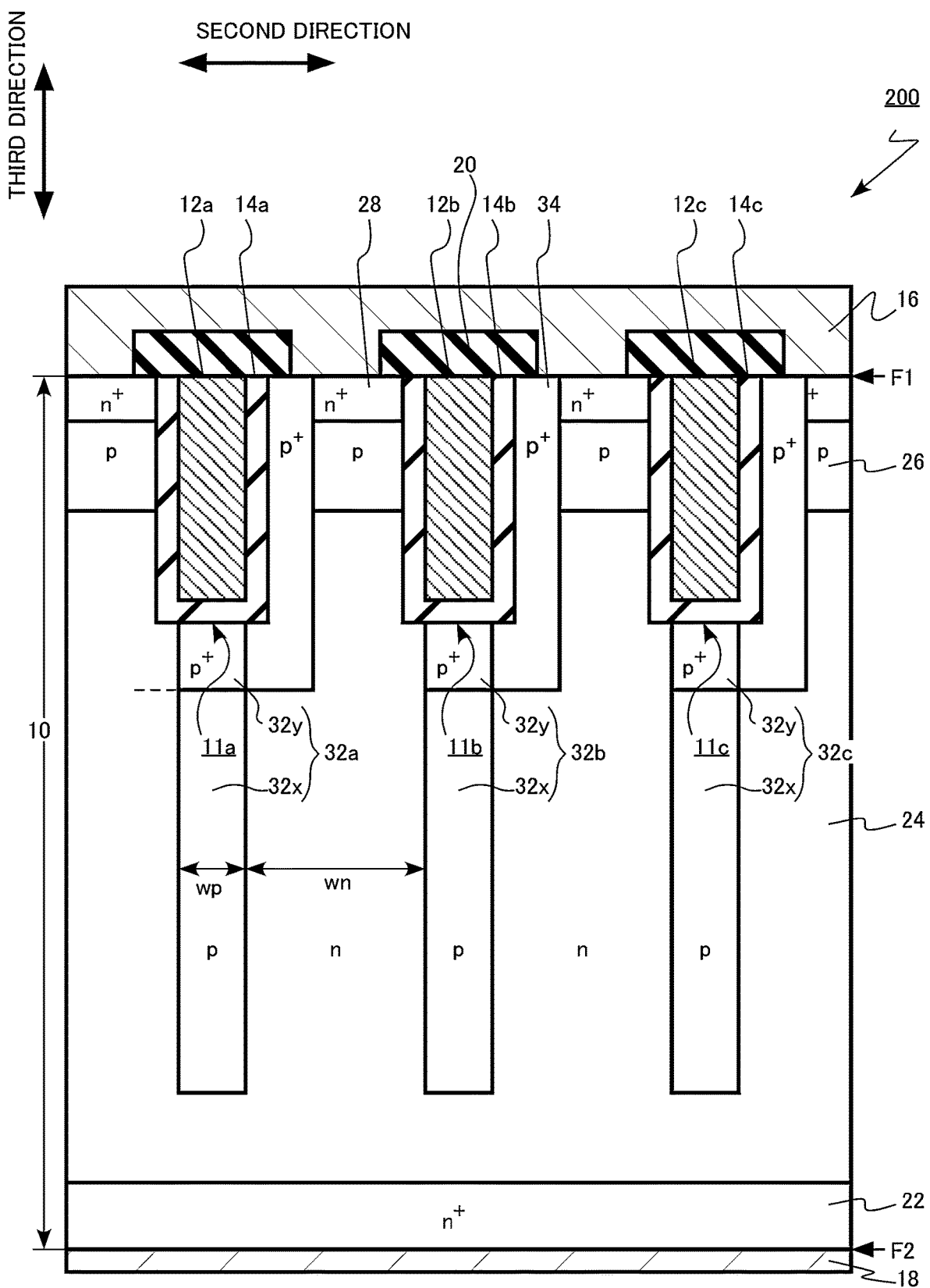
FIG. 13 is a schematic cross-sectional view of a semiconductor device of a second embodiment.
Figure 14:
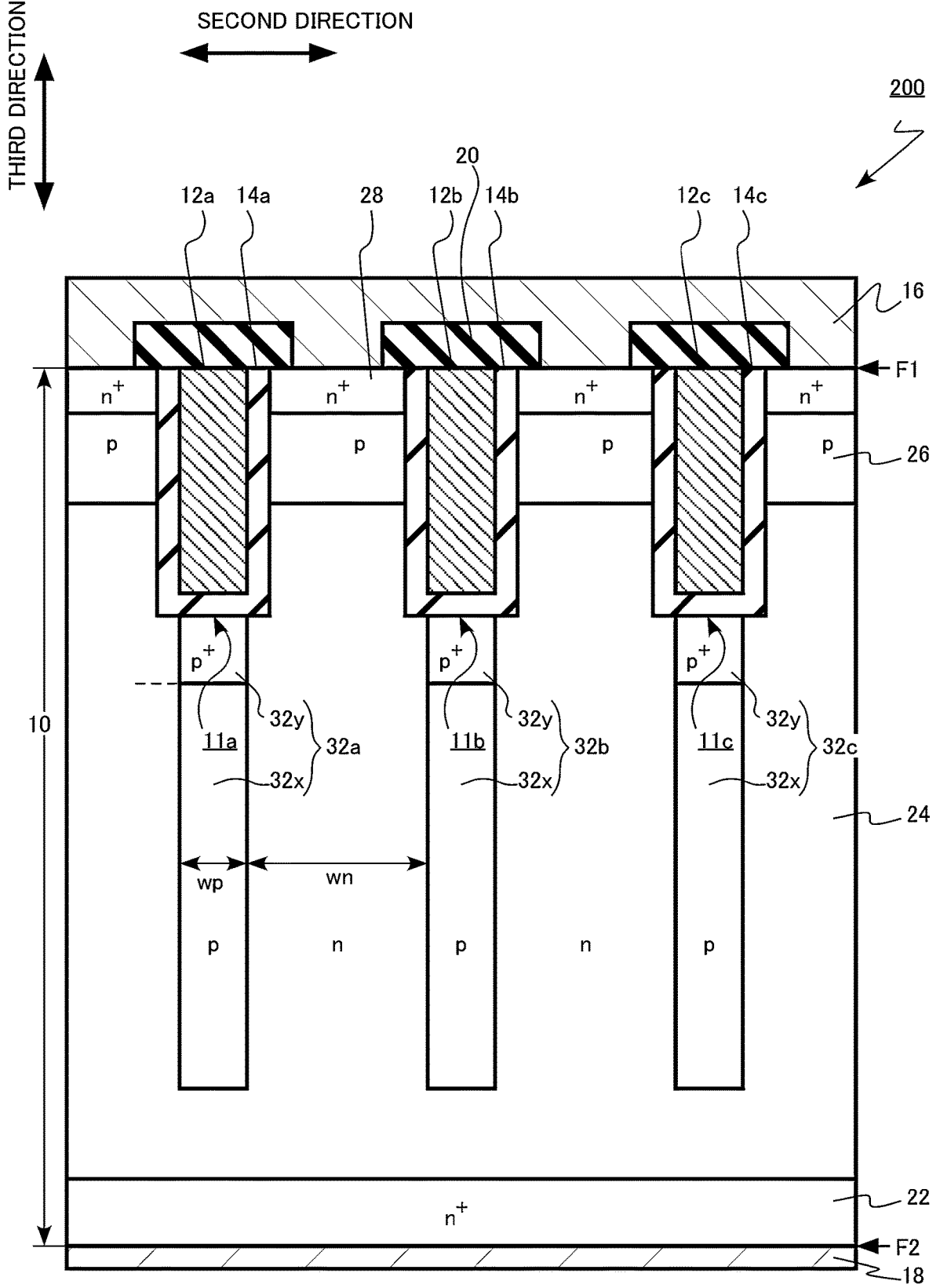
FIG. 14 is a schematic cross-sectional view of the semiconductor device of the second embodiment.

FIGS. 13 and 14 are schematic cross-sectional views of the semiconductor device of the second embodiment. The semiconductor device of the second embodiment is a vertical MOSFET 200 of trench gate type using silicon carbide. The MOSFET 200 is a MOSFET of n-channel type using electrons as carriers. The MOSFET 200 has an SJ structure.

Figure 15:
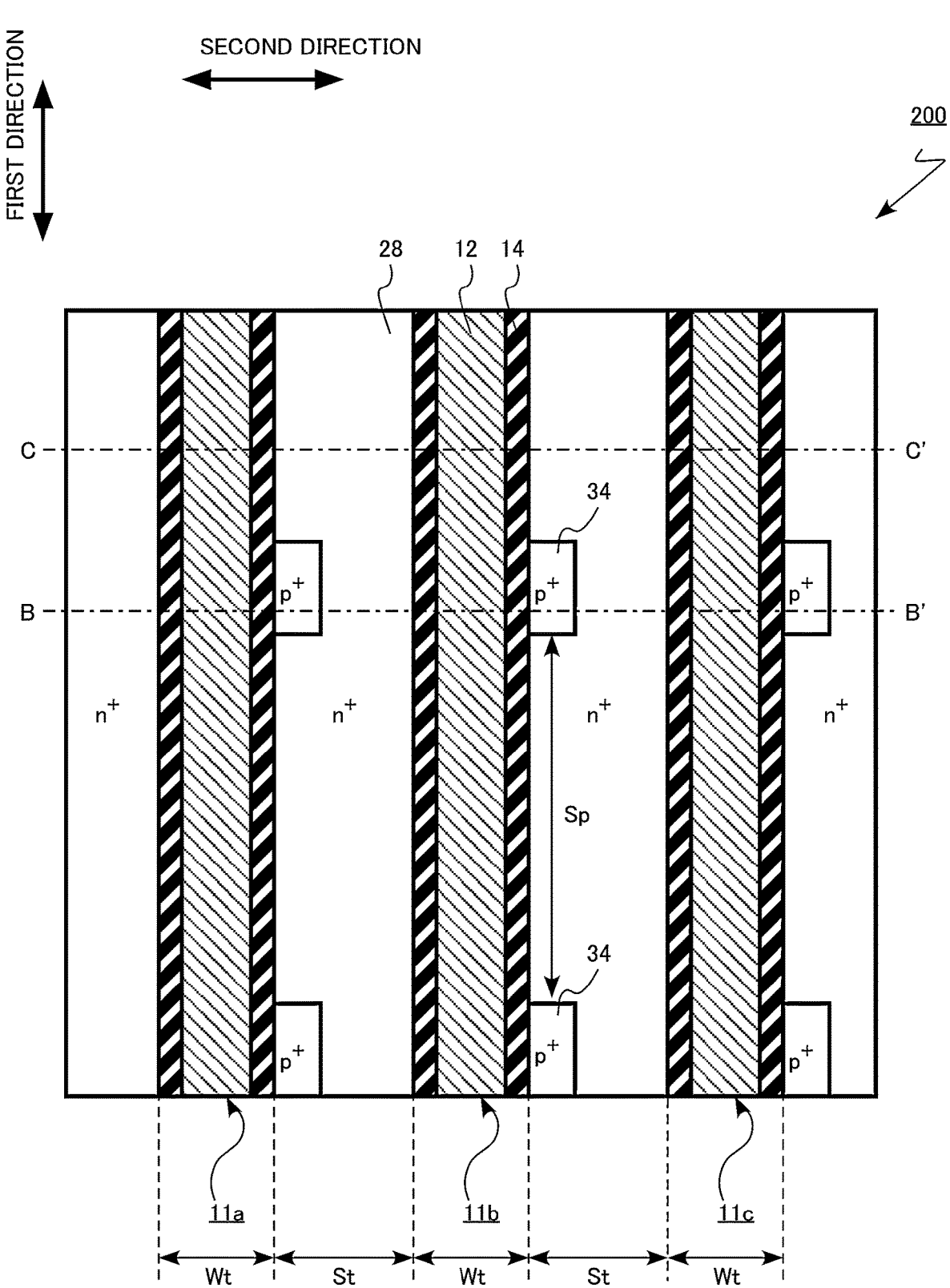
FIG. 15 is a schematic plan view of the semiconductor device of the second embodiment.

FIG. 15 is a schematic plan view of the semiconductor device of the second embodiment. FIG. 15 is a plan view of a first face (F1 in FIGS. 13 and 14) in FIGS. 13 and 14. A first direction and a second direction are directions parallel to the first face F1. In addition, the second direction is a direction perpendicular to the first direction. FIG. 13 is a BB' cross section of FIG. 15. FIG. 14 is a CC' cross section of FIG. 15.

The MOSFET 200 includes a silicon carbide layer 10, a first trench 11a, a second trench 11b, a third trench 11c, a first gate electrode 12a, a second gate electrode 12b, a third gate electrode 12c, a first gate insulating layer 14a, a second gate insulating layer 14b, a third gate insulating layer 14c, a source electrode 16 (first electrode), a drain electrode 18 (second electrode), and an interlayer insulating layer 20.

An n⁺-type drain region 22, an n-type drift region 24 (first silicon carbide region), a p-type body region 26 (second silicon carbide region), an n⁺-type source region 28 (third silicon carbide region), a p-type first pillar region 32a (fourth silicon carbide region), a p-type second pillar region 32b (fifth silicon carbide region), and a p⁺-type connection region 34 (sixth silicon carbide region) are provided in the silicon carbide layer 10.

The p⁺-type connection region 34 is in contact with the pillar region 32. The connection region 34 is provided between the drift region 24 and the trench 11. The connection region 34 is provided between the body region 26 and the trench 11. The connection region 34 is provided between the source region 28 and the trench 11.

The p⁺-type connection region 34 is in contact with the first pillar region 32a. The connection region 34 is provided between the drift region 24 and the first trench 11a. The connection region 34 is provided between the body region 26 and the first trench 11a. The connection region 34 is provided between the source region 28 and the first trench 11a.

The connection region 34 is in contact with the side surface of the trench 11. The connection region 34 is in contact with, for example, the bottom surface of the trench 11. The connection region 34 is in contact with, for example, the first face F1.

The connection region 34 is in contact with the side surface of the first trench 11a. The connection region 34 is in contact with, for example, the bottom surface of the first trench 11a.

The connection region 34 is in contact with the gate insulating layer 14. The connection region 34 is in contact with, for example, the source electrode 16 on the first face F1.

As illustrated in FIG. 15, the plurality of connection regions 34 are repeatedly disposed at intervals Sp in the first direction.

The connection region 34 has a function of electrically connecting the pillar region 32 and the source electrode 16. The connection region 34 is a connection portion that connects the pillar region 32 and the source electrode 16. The pillar region 32 is fixed to an electric potential of the source electrode 16 by the connection region 34. The pillar region 32 is fixed to a source electric potential by the connection region 34.

In addition, the connection region 34 has a function of reducing the electric resistance between the source electrode 16 and the body region 26.

The semiconductor device of the second embodiment can be formed by, for example, implanting carbon (C) and aluminum (Al) from the side surface of the trench 11 by using an oblique ion implantation method after the trench 11 and is formed before the sidewall material 44 is formed in the manufacturing method of the first embodiment.

The MOSFET 200 has the connection region 34 that electrically connects the pillar region 32 and the source electrode 16. Accordingly, when the MOSFET 200 is turned off, the discharge of holes from the pillar regions 32 is promoted. Thus, a switching loss of the MOSFET 200 can be reduced.

In addition, the MOSFET 200 has the connection region 34, and thus, it is not necessary to provide the p⁺-type contact region on the first face F1 like the MOSFET 100. Accordingly, for example, the interval St between two adjacent trenches can be reduced, and an on-resistance of the MOSFET 200 can be reduced. Even though the impurity concentration of the connection region 34 is increased, since the impurity concentration does not spread due to diffusion, the high impurity concentration can be realized. Sp in FIG. 15 can be more than when diffusion suppression is not performed. The channel area per unit area increases, and the on-resistance of the MOSFET 200 can be further reduced. Even though the impurity concentration of the connection region 34 is increased, since the impurity concentration does not spread due to diffusion, the high impurity concentration can be realized.

As described above, according to the semiconductor device and the method of manufacturing a semiconductor device of the second embodiment, it is possible to reduce the on-resistance.

Third Embodiment

An inverter circuit and a drive device of a third embodiment are an inverter circuit and a drive device including the semiconductor device of the first embodiment.

Figure 16:
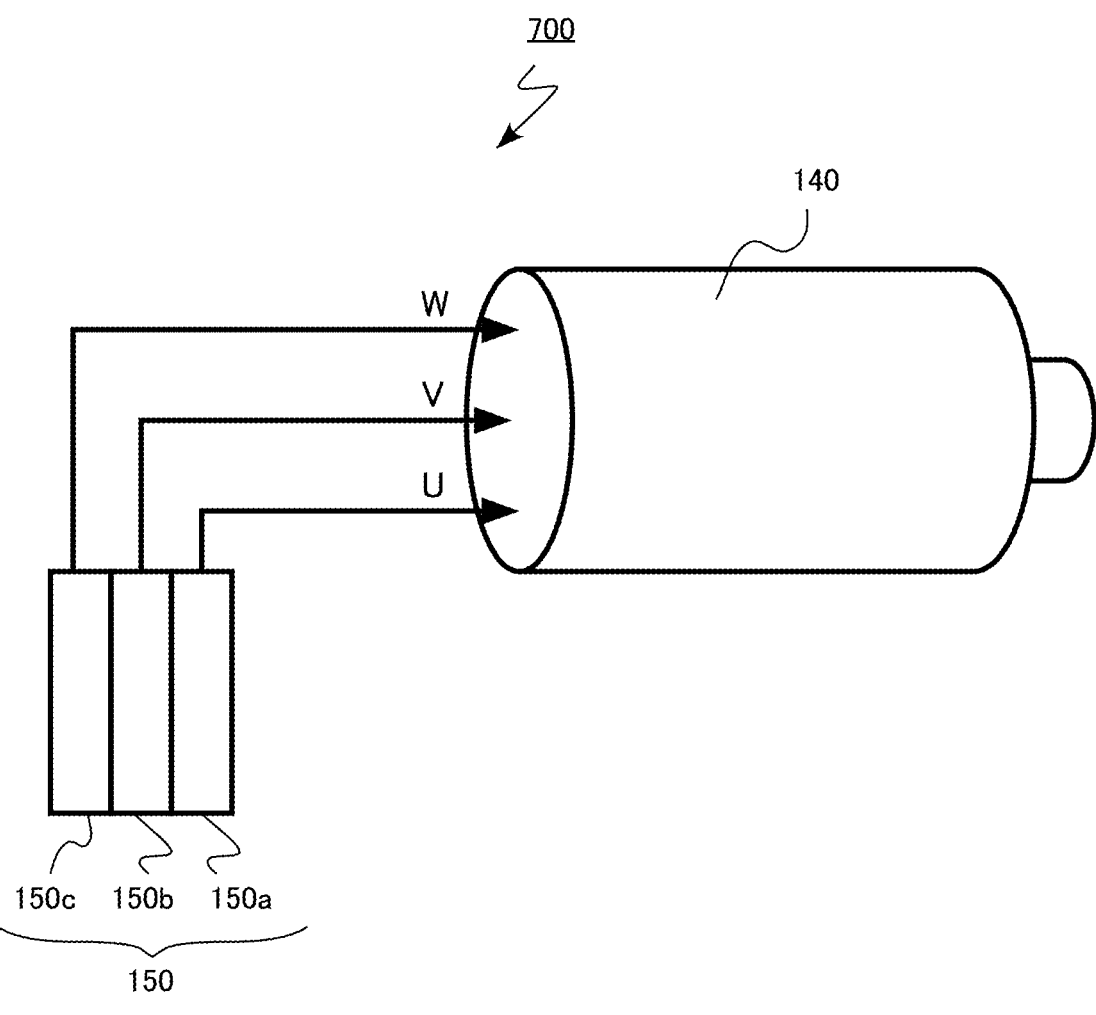
FIG. 16 is a schematic diagram of a drive device of a third embodiment.

FIG. 16 is a schematic diagram of the drive device of the third embodiment. A drive device 700 includes a motor 140 and an inverter circuit 150.

The inverter circuit 150 includes three semiconductor modules 150*a*, 150*b*, and 150*c* each using the MOSFET 100 of the first embodiment as a switching element. Three semiconductor modules 150*a*, 150*b*, and 150*c* are connected in parallel, and thus, a three-phase inverter circuit 150 including three AC voltage output terminals U, V, and W is realized. The motor 140 is driven by an AC voltage output from the inverter circuit 150.

According to the third embodiment, the MOSFET 100 having improved characteristics is included, and thus, characteristics of the inverter circuit 150 and the drive device 700 are improved.

Fourth Embodiment

A vehicle of a fourth embodiment is a vehicle including the semiconductor device of the first embodiment.

Figure 17:
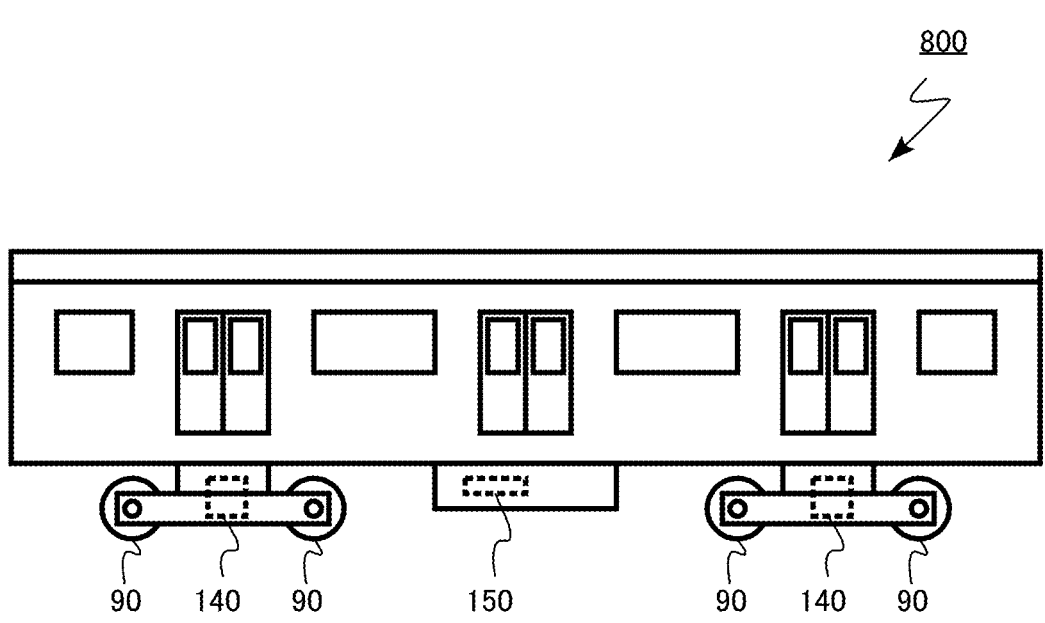
FIG. 17 is a schematic diagram of a vehicle of a fourth embodiment.

FIG. 17 is a schematic diagram of the vehicle of the fourth embodiment. A vehicle 800 of the fourth embodiment is a railway vehicle. The vehicle 800 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized. The motor 140 is driven by an AC voltage output from the inverter circuit 150. Wheels 90 of the vehicle 800 are rotated by the motor 140.

According to the fourth embodiment, the MOSFET 100 having improved characteristics is included, and thus, characteristics of the vehicle 800 are improved.

Fifth Embodiment

A vehicle of a fifth embodiment is a vehicle including the semiconductor device of the first embodiment.

Figure 18:
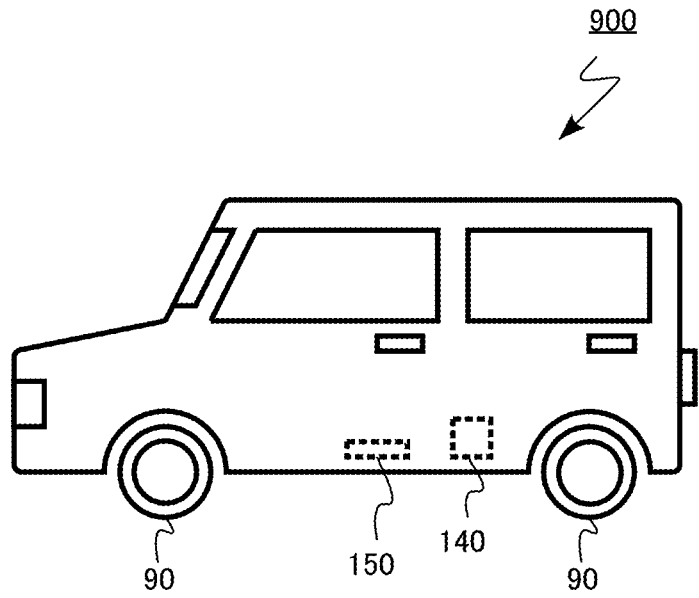
FIG. 18 is a schematic diagram of a vehicle of a fifth embodiment.

FIG. 18 is a schematic diagram of the vehicle of the fifth embodiment. A vehicle 900 of the fifth embodiment is an automobile. The vehicle 900 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. Wheels 90 of the vehicle 900 are rotated by the motor 140.

According to the fifth embodiment, the MOSFET 100 having improved characteristics is included, and thus, characteristics of the vehicle 900 are improved.

Sixth Embodiment

An elevator of a sixth embodiment is an elevator including the semiconductor device of the first embodiment.

Figure 19:
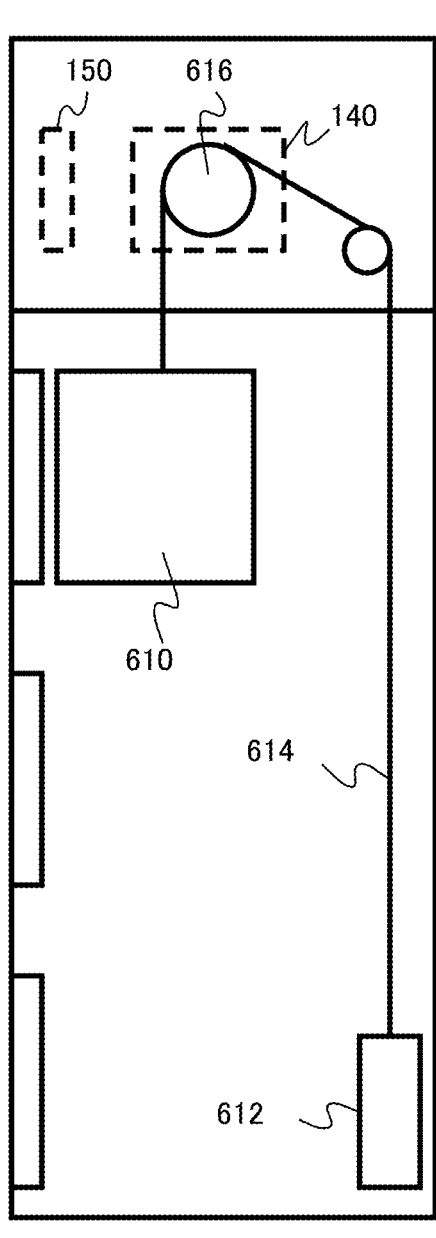
FIG. 19 is a schematic diagram of an elevator of a sixth embodiment.

FIG. 19 is a schematic diagram of the elevator of the sixth embodiment. An elevator 1000 of the sixth embodiment includes a car 610, a counterweight 612, a wire rope 614, a hoist 616, a motor 140, and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. The hoist 616 is rotated by the motor 140, and thus, the car 610 moves up.

According to the sixth embodiment, the MOSFET 100 having improved characteristics is included, and thus, characteristics of the elevator 1000 are improved.

In the first and second embodiments, although it has been described that aluminum (Al) is an example of the p-type impurity, boron (B) can also be applied as the p-type impurity.

In the first embodiment, it has been described that the first ion implantation is performed before the second ion implantation, the first ion implantation may be performed after the second ion implantation.

In the first to second embodiments, although it has been described that 4H—SiC is used as the crystal structure of the silicon carbide, the present disclosure can be applied to silicon carbide having other crystal structures such as 6H—SiC and 3C—SiC.

In the first and second embodiments, although it has been described that the MOSFET is an example of the semiconductor device, but the present disclosure can also be applied to an insulated gate bipolar transistor (IGBT). For example, an IGBT can be realized by replacing a region corresponding to the drain region 22 of the MOSFET 100 from n-type to p-type.

In addition, although it has been described in the third to sixth embodiments that the semiconductor device of the present disclosure is applied to the vehicle or the elevator, the semiconductor device of the present disclosure can be applied to, for example, a power conditioner of a solar power generation system.

In addition, although it has been described in the third to sixth embodiments that the semiconductor device of the first embodiment is applied, the semiconductor device of the second embodiment can also be applied.

While certain embodiments have been described, these embodiments have been presented by way of example only, and are not intended to limit the scope of the inventions. Indeed, the semiconductor device, the method of manufacturing a semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:

forming a mask material having an opening on a surface of a silicon carbide layer;

forming a trench in the silicon carbide layer by using the mask material as a mask;

performing first ion implantation for implanting carbon (C) to form a carbon region by using the mask material as a mask, a depth of the carbon region from the surface being equal to or more than twice a depth of the trench from the surface;

forming a sidewall material on a side surface of the trench after the performing the first ion implantation;

performing second ion implantation for implanting aluminum (Al) to form a first impurity region by using the sidewall material as a mask, a depth of the first impurity region from the surface being equal to or more than twice the depth of the trench from the surface;

performing third ion implantation for implanting aluminum (Al) to form a second impurity region by using the sidewall material as a mask, a depth of the second impurity region from the surface being shallower than the depth of the first impurity region from the surface; and performing a heat treatment at a temperature equal to or more than 1600° C., after the performing second ion implantation and the performing third ion implantation, wherein a dose amount of carbon (C) implanted by the first ion implantation is equal to or more than 10 times a dose amount of aluminum (Al) implanted by the second ion implantation, an aluminum (Al) concentration of the second impurity region is more than an aluminum (Al) concentration of the first impurity region, the aluminum (Al) concentration of the first impurity region is more than $1 \times 10^{17}$ cm$^{-3}$, and the aluminum (Al) concentration of the second impurity region is more than $1 \times 10^{20}$ cm$^{-3}$.

2. The method of manufacturing a semiconductor device according to claim 1, wherein the first ion implantation is performed at a temperature equal to or more than 1000° C.

3. The method of manufacturing a semiconductor device according to claim 1, wherein the second ion implantation is performed at a temperature equal to or more than 1000° C.

4. The method of manufacturing a semiconductor device according to claim 1, wherein the second ion implantation is performed a plurality of times while an accelerating voltage is changed.

* * * * *